(12) United States Patent
Akarvardar et al.

(10) Patent No.: US 11,735,515 B2
(45) Date of Patent: Aug. 22, 2023

(54) METHOD FOR LOW-COST, HIGH-BANDWIDTH MONOLITHIC SYSTEM INTEGRATION BEYOND RETICLE LIMIT

(71) Applicant: TAIWAN SEMICONDUCTOR MANUFACTURING COMPANY, LTD., Hsinchu (TW)

(72) Inventors: Murat Kerem Akarvardar, Hsinchu (TW); Hon-Sum Philip Wong, Stanford, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 124 days.

(21) Appl. No.: 17/163,080

(22) Filed: Jan. 29, 2021

(65) Prior Publication Data
US 2021/0407901 A1 Dec. 30, 2021

Related U.S. Application Data

(60) Provisional application No. 63/046,233, filed on Jun. 30, 2020.

(51) Int. Cl.
*H01L 23/522* (2006.01)
*H01L 21/78* (2006.01)
*H01L 23/31* (2006.01)

(52) U.S. Cl.
CPC .......... *H01L 23/5221* (2013.01); *H01L 21/78* (2013.01); *H01L 23/3135* (2013.01)

(58) Field of Classification Search
CPC . H01L 23/5221; H01L 21/78; H01L 23/3135; H01L 24/16; H01L 24/42;
(Continued)

(56) References Cited

U.S. PATENT DOCUMENTS

2013/0037935 A1\* 2/2013 Xue ................ H01L 23/3114
257/737
2015/0371956 A1\* 12/2015 Agarwal .......... H01L 21/76898
438/424
(Continued)

FOREIGN PATENT DOCUMENTS

TW 201944574 A 11/2019
TW 202011489 A 3/2020
(Continued)

OTHER PUBLICATIONS

R. Turchetta et al., "Large area CMOS image sensors," Journal of Instrumentation, 12th International Workshop on Radiation Imaging Detectors, Robinson College, Cambridge U.K., 2010.
(Continued)

*Primary Examiner* — Thanh T Nguyen
(74) *Attorney, Agent, or Firm* — McDermott Will & Emery LLP

(57) ABSTRACT

A semiconductor monolithic IC includes a semiconductor substrate having a rectangular shape in plan view, multiple chiplets each comprising a circuit, wherein the multiple chiplets are disposed over the semiconductor substrate and are separated from each other by die-to-die spaces filled with a dielectric material, and a plurality of conductive connection patterns electrically connecting the multiple chiplets so that a combination of the circuit of the multiple chiplet function as one functional circuit. The chip region has a larger area than a maximum exposure area of a lithography apparatus used to fabricate the first and second circuits.

20 Claims, 23 Drawing Sheets

(58) Field of Classification Search
CPC . H01L 2224/16225; H01L 2224/16235; H01L 2224/48091; H01L 2924/15311; H01L 2924/181; H01L 21/76811; H01L 21/76813; H01L 23/522; H01L 23/528; H01L 25/0655; H01L 21/0274; H01L 21/50; H01L 23/50; H01L 2924/00012; H01L 2924/00014
See application file for complete search history.

(56) References Cited

U.S. PATENT DOCUMENTS

| | | | |
|---|---|---|---|
| 2018/0068047 A1* | 3/2018 | van Kervinck | H01L 21/027 |
| 2018/0096952 A1* | 4/2018 | Miccoli | H01L 23/562 |
| 2021/0366854 A1* | 11/2021 | Yu | H01L 23/481 |

FOREIGN PATENT DOCUMENTS

| | | |
|---|---|---|
| TW | 202021073 A | 6/2020 |
| TW | 202021077 A | 6/2020 |

OTHER PUBLICATIONS

M. Vinet et al., "Monolithic 3D Integration: a powerful alternative to classical 2D Scaling," IEEE, 2014.
R. Mahajan et al., "Embedded Multi-Die Interconnect Bridge (EMIB) â€ A High Density, High Bandwidth Packaging Interconnect," IEEE 66th Electronic Components and Technology Conference, 2016.
"Wafer-Scale Deep Learning," Cerebras Systems 31 pages.
S.Y. Hou et al., "Wafer-Level Integration of an Advanced Logic-Memory System Through the Second-Generation CoWoS Technology," IEEE Transactions on Electron Devices, vol. 64, No. 10, 2017.
K. Akarvardar et al., "Method for Low-Cost, High-Bandwidth Monolithic System Integration Beyond Reticle Limit," 29 pages.

* cited by examiner

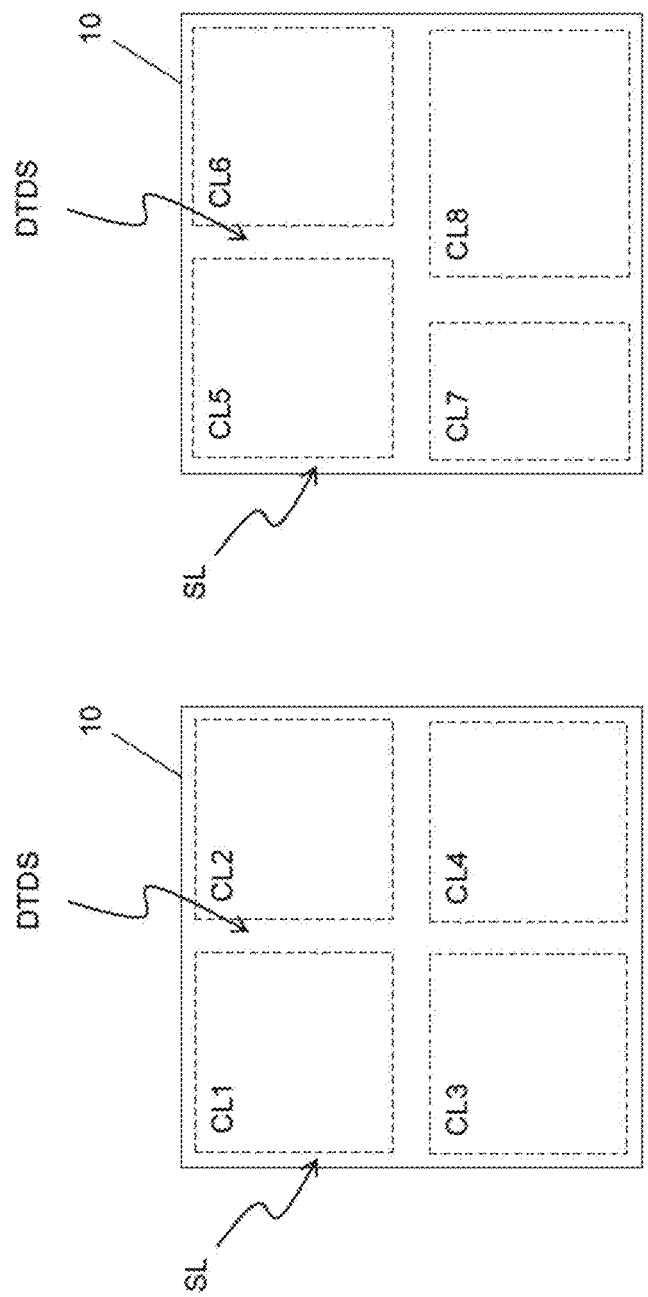

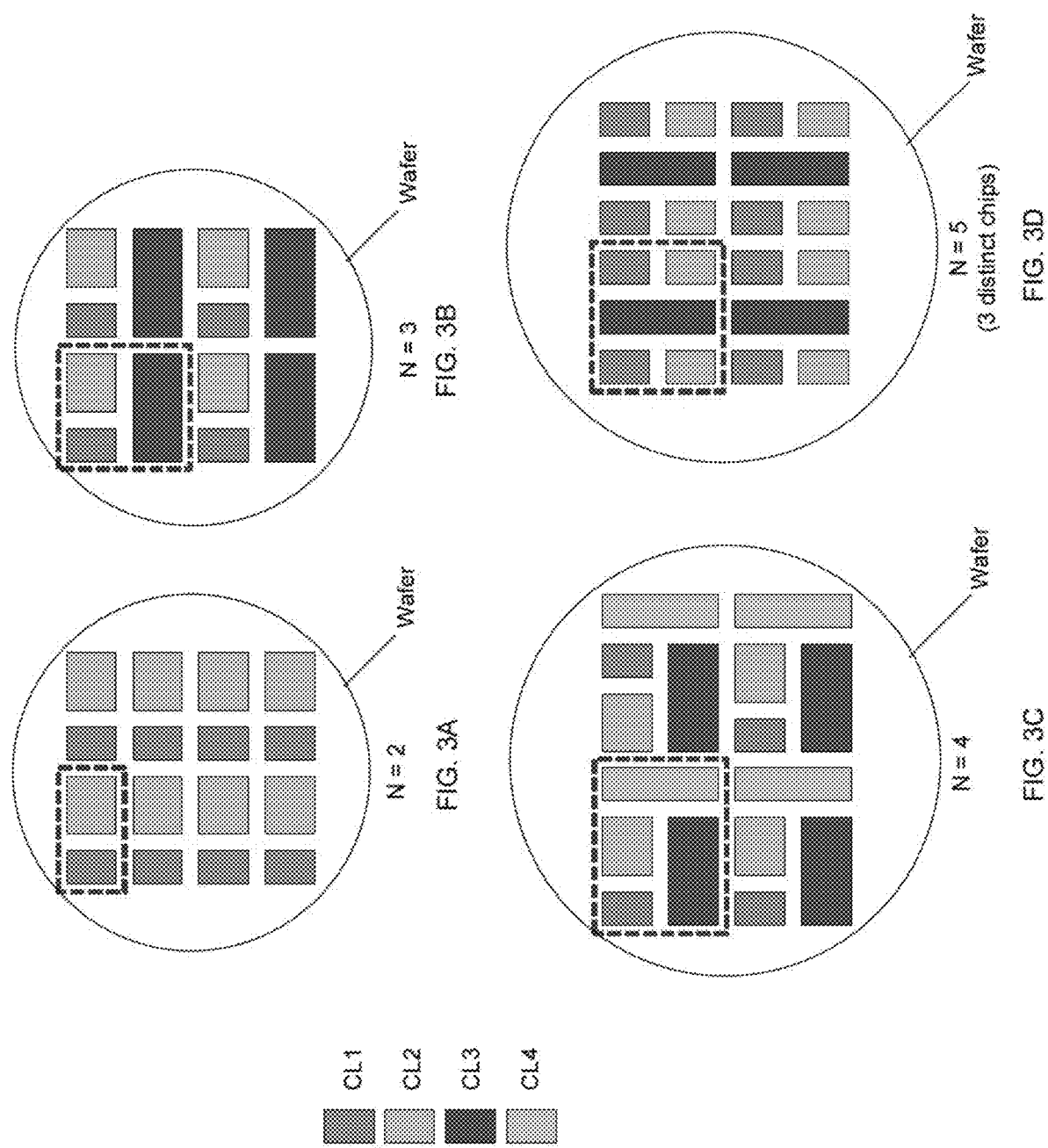

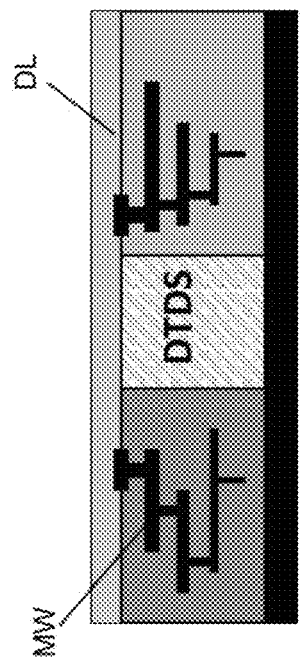
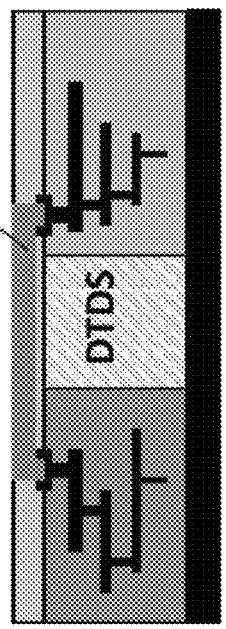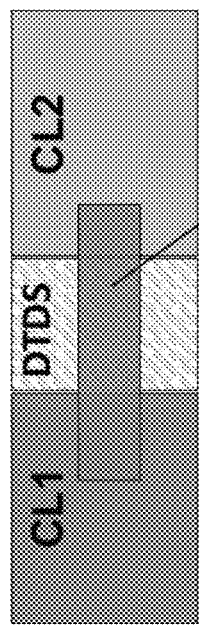
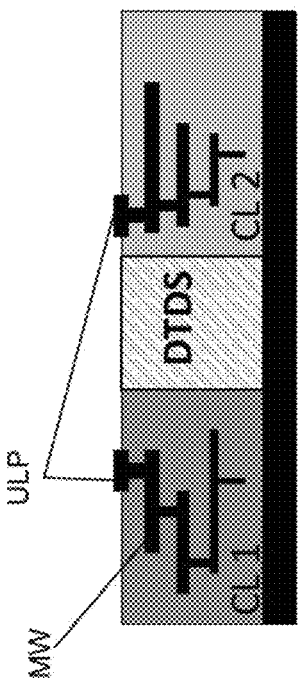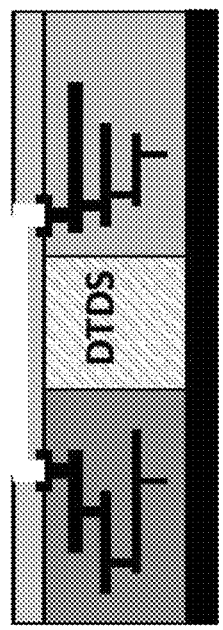

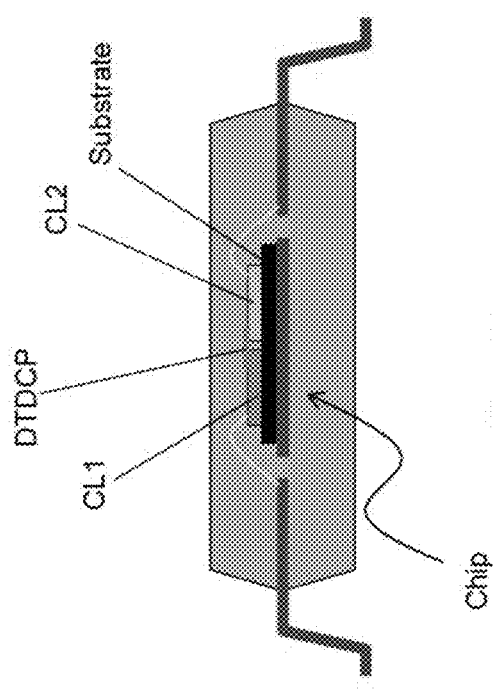
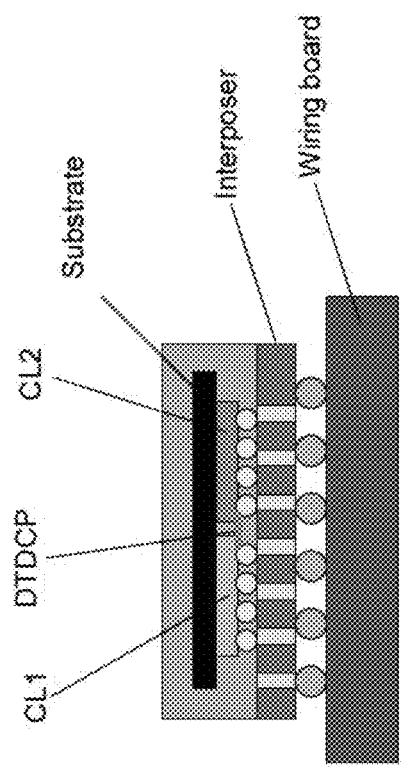
FIG. 21A
FIG. 21B

METHOD FOR LOW-COST, HIGH-BANDWIDTH MONOLITHIC SYSTEM INTEGRATION BEYOND RETICLE LIMIT

RELATED APPLICATION

This application claims priority to U.S. Provisional Patent Application No. 63/046,233 filed on Jun. 30, 2020, the entire content of which is incorporated herein by reference.

BACKGROUND

As the semiconductor industry has progressed into nanometer technology process nodes in pursuit of higher device density, higher performance, and lower costs, challenges from both fabrication and design issues warrant for three-dimensional integration and multi-chip systems.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B illustrate schematic plan views (layout) of a semiconductor monolithic IC according to embodiments of the present disclosure.

FIGS. 3A, 3B, 3C and 3D illustrate layouts of the chiplets (dies) over a wafer according to embodiments of the present disclosure.

FIGS. 7A, 7B, 7C, 7D and 7E show various views of a sequential process for fabricating die-to-die (DTD) connection patterns according to embodiments of the present disclosure.

FIGS. 21A, 21B and 21C illustrate packages for semiconductor devices including multiple chiplets (dies) in a signal chip according to embodiments of the present disclosure.

DETAILED DESCRIPTION

Figures 2A, 2B, 2C:
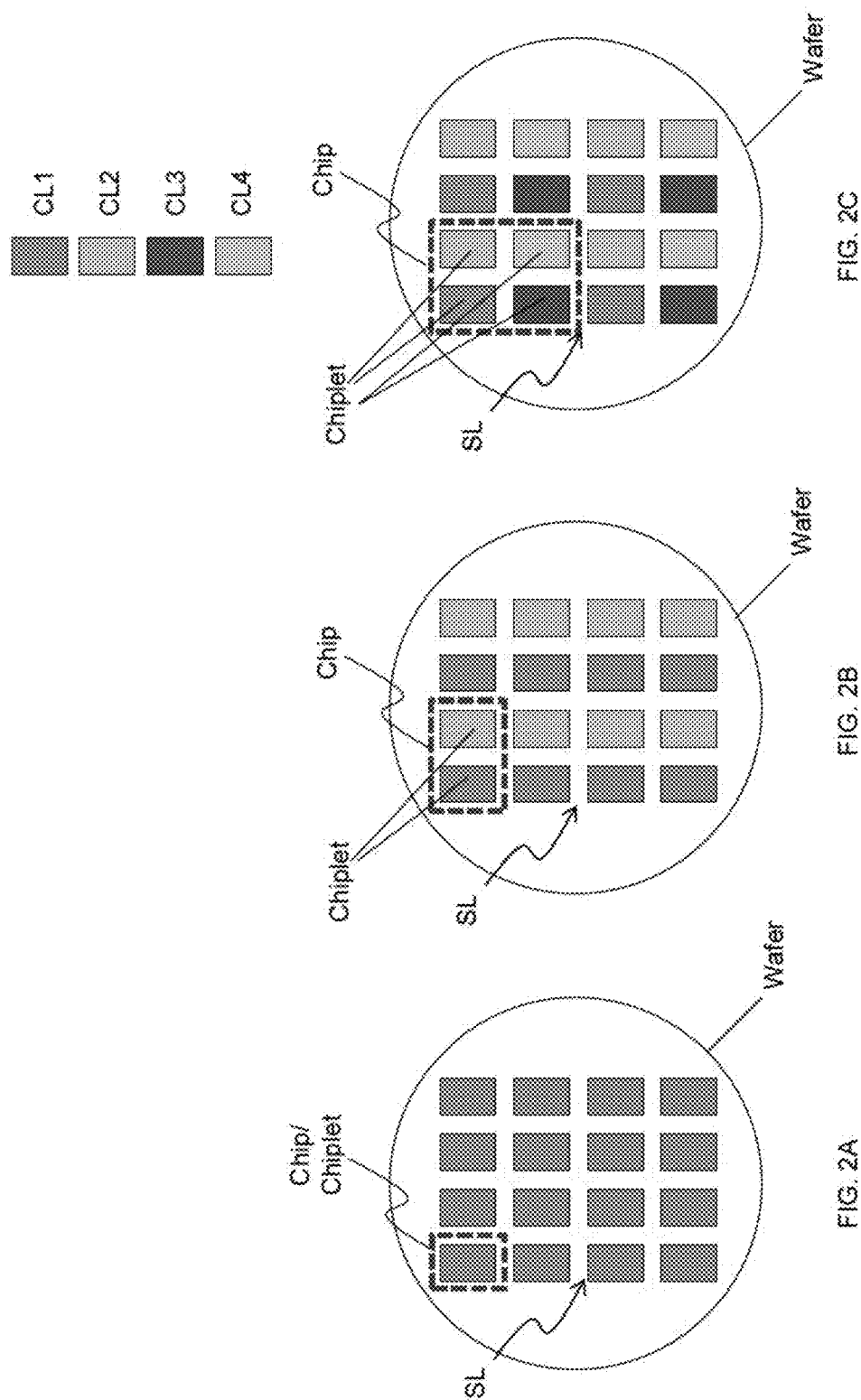
FIGS. 2A, 2B and 2C illustrate layouts of the chiplets (dies) over a wafer according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Multi-chip systems including monolithic integrated circuits and systems are preferable for discrete alternatives to current integrated circuits due to better performance, lower power consumption and reliability. However, currently, a cost-effective, high-yield monolithic system integration scheme is not available. One of the alternatives is monolithic 3D integrated systems, which suffer from high cost due to sequential integration, low yield due to process complexity, and poor device performance associated with thermal limitations of processes for upper metal wiring layers. Another alternative is a 2.5D/3D packaging, which is a method for a "system in package" (SiP), and enables many commercial high performance computing products. However, these systems and methods are not a monolithic integrated circuit, and require an assembly process of multiple chips in a package. The assembly processes typically require one or more of the following processes, which increase the cost: fabricating interposers and through silicon vias (TSVs), a wafer thinning process, a bonding process and mask stitching techniques. Further, given the limited bonding pitch, the number of die-to-die interconnects remains limited, which imposes a higher bound to achievable bandwidth (amount of bytes transferred between dies per second).

In the present disclosure, a novel process and device that achieves an improved monolithic system are provided, which makes it possible to combine on a 2D plane an arbitrarily large number of chiplets beyond a photo mask area limit.

In the present disclosure, a monolithic integrated circuit (IC) generally refers to a semiconductor device including multiple chiplets formed over a single semiconductor substrate, which is diced from a semiconductor wafer. A chip or a semiconductor chip refers to a semiconductor substrate that is diced from a wafer or to be diced from the wafer. In some embodiments, the multiple chiplets are molded into a single resin package with lead frames. A chiplet is also referred to as a die, which generally means a circuit area that performs given functionalities with or without another chiplet, and surrounded by a scribe lane and/or a die-to-die space. A size of a chiplet generally corresponds to an exposure area set in lithography operations, and is equal to or smaller than the maximum exposure area that can be set in a lithography apparatus (stepper or scanner). Thus, the monolithic IC having multiple chiplets on a single semiconductor substrate can have a larger size than the maximum exposure area. A state-of-the-art exposure tool (e.g., KrF, ArF scanners or EUV scanner) utilizes a 6-inch reticle/photo mask (a 150 mm square substrate) are imaged on a wafer with ¼× reduction, such that the maximum exposure area of a field on the wafer is 26×33 mm$^2$ (104×132 mm$^2$ on the reticle).

FIGS. 1A and 1B illustrate schematic plan views (layout) of a monolithic IC according to embodiments of the present disclosure. In FIG. 1A, in some embodiments, four chiplets CL1, CL2, CL3 and CL4 are formed on a semiconductor substrate 10. In some embodiments, the chiplets CL1, CL2, CL3 and CL4 have different circuit layouts and/or different functions. In some embodiments, one of the chiplets may be comprised of a memory device, such as a dynamic random access memory (DRAM), a static RAM (SRAM), a flash memory, or other CMOS-based memory device, as its major circuit (occupying, for example, more than 75% of the chiplet area). Die-to-die spaces DTDS are provided between adjacent chiplets, and a scribe lane SL surrounds the four chiplets. During the fabrication of monolithic ICs, multiple monolithic ICs are formed on a semiconductor wafer (e.g., 300 mm, 200 mm or 150 mm Si wafer). The scribe lanes are provided between adjacent monolithic IC areas, and have the same width as the die-to-die space within each monolithic IC in some embodiments. Since the wafer is diced into multiple monolithic IC chips, by dicing the scribe lanes, the width of the scribe lane SL is smaller than the width of the die-to-die space DTDS. In some embodiments, test patterns, measurement patterns or other patterns that do not function as a part of the functional circuit of each chiplet other than wiring patterns electrically connecting adjacent chiplets are provided on the scribe lane SL and/or the die-to-die space DTDS.

As shown in FIGS. 1A and 1B, four chiplets are provided, but the number of chiplets in one monolithic IC is not limited to four, and may be two, three, five, six or more. In some embodiments, as shown in FIG. 1A, four chiplets CL1-CL4 have the same area (area surrounded by the scribe lane and the die-to-die space). In other embodiments, one or more of the chiplets have a different size from another chiplet. In some embodiments, as shown in FIG. 1B, chiplet CL5 and CL6 have the same size (die size) and chiplet CL7 and CL8 have different sizes from each other and from the chiplets CL5 and CL6. In some embodiments, the width of the die-to-die space DTDS is the same for adjacent chiplets, respectively. In other embodiments, the width of the die-to-die space DTDS are different. FIGS. 2A, 2B and 2C illustrate layouts of the chiplets over a wafer according to embodiments of the present disclosure. FIG. 2A shows a single type of chiplet in a chip. FIG. 2B shows a monolithic IC case in which two different types of chiplets are formed in one chip. FIG. 2C shows a monolithic IC case in which four different types of chiplets are formed in one chip. After all necessary processes to fabricate chips are performed, the wafer is diced by cutting along the scribe lanes into multiple chips. The outline of the wafer is shown only for illustration purpose, and the size of the wafer may be larger than illustrated (i.e., the chip size is smaller than illustrated). In some embodiments, the size of the chiplets within one chip is the same.

FIGS. 3A, 3B, 3C and 3D illustrate layouts of the chiplets over a wafer according to embodiments of the present disclosure. The outline of the wafer is shown only for illustration purpose, and the size of the wafer may be larger than illustrated (i.e., the chip size is smaller than illustrate). Unlike the embodiments of FIGS. 2B and 2C, the size of the chiplets within one chip is not the same. The exposure area for different die sizes is adjusted by adjusting mask blades and the step size of the exposure apparatus in some embodiments.

FIG. 3A shows a monolithic IC (chip) including two chiplets having different sizes in a chip. FIG. 3B shows a monolithic IC including three chiplets having different sizes from each other formed in one chip. FIG. 3C shows a monolithic IC including four chiplets having different sizes from each other formed in one chip.

FIG. 3D shows a monolithic IC including five chiplets. In some embodiments, two first chiplets having the same first circuit pattern (same functionality), two second chiplet having the same second circuit pattern and one third chiplet having a third circuit pattern are formed in one chip. In some embodiments, the same circuit pattern means more than 90% of circuit patterns in the chiplets are identical to each other. In some embodiments, the identically is equal to or less than 100%. In some embodiments, the size of the first chiplet is the same as the size of the second chiplet and different from the third chiplet.

The number of the chiplets and/or the size of the chiplets are not limited to those shown in FIGS. 2B, 2C and 3A-3D.

Figure 4:
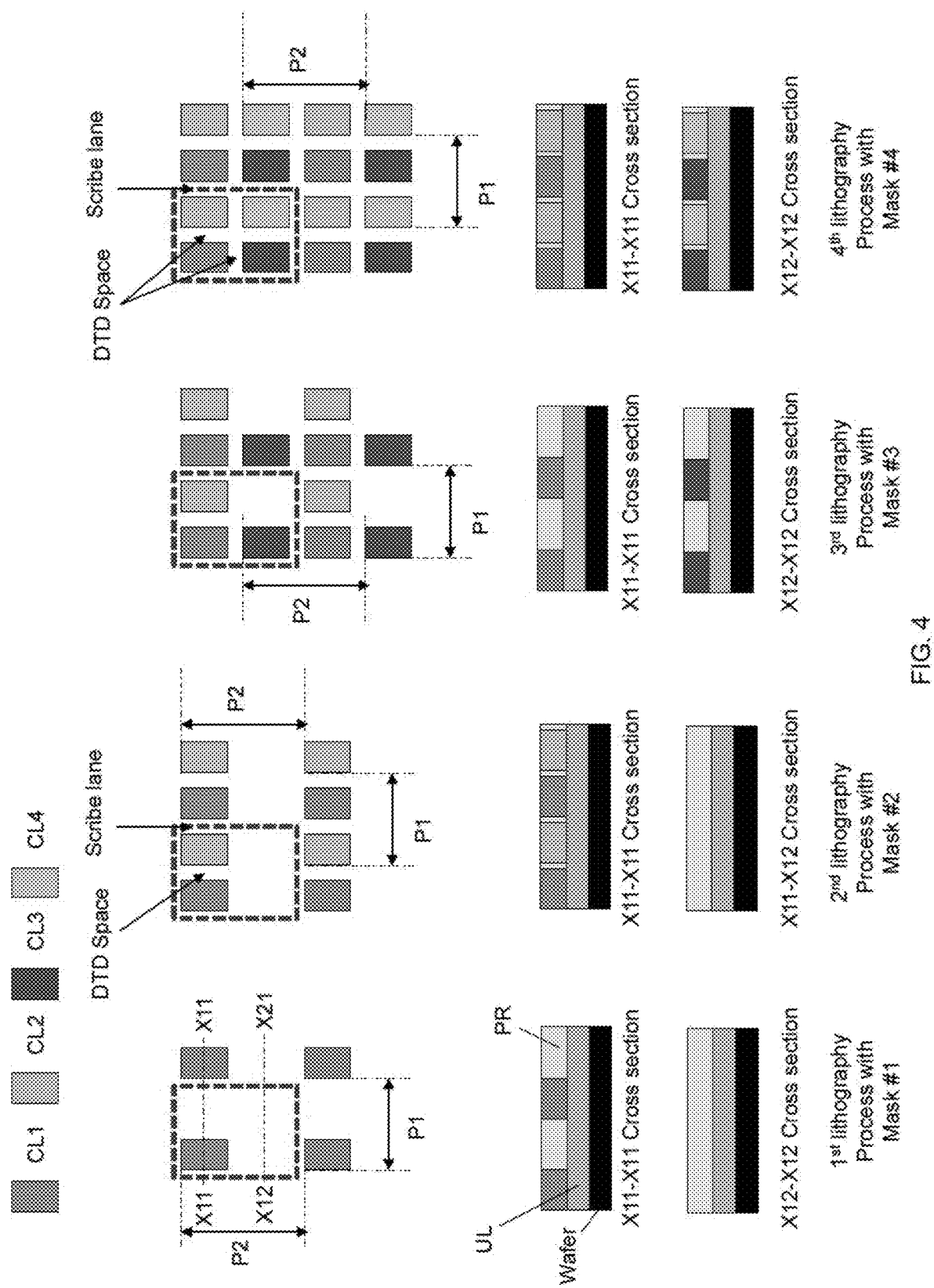
FIG. 4 illustrate a lithography operation for a semiconductor device including multiple chiplets (dies) in a signal chip according to embodiments of the present disclosure.

FIG. 4 illustrate a lithography operation for a monolithic IC according to embodiments of the present disclosure. FIG. 4 illustrates a plan view (layout view) and cross sectionals views corresponding to lines X11-X11 and X12-X12 for each exposure step.

In some embodiments, a photo resist layer PR is formed over an underlying layer UL to be patterned formed over a semiconductor wafer. In one embodiment, the wafer includes a single crystalline semiconductor layer on at least it surface portion. The wafer may include a single crystalline semiconductor material such as, but not limited to Si, Ge, SiGe, GaAs, InSb, GaP, GaSb, InAlAs, InGaAs, GaSbP, GaAsSb and InP. The photo resist may be a positive tone or negative tone photo resist. The underlying layer UL includes one or more of dielectric materials (e.g., silicon oxide, silicon nitride, SiON, SiOCN, SiOC, aluminum oxide, hafnium oxide, etc.), semiconductor materials (epitaxially formed semiconductor material, polysilicon, amorphous silicon, etc.) or conductive material (metal or metal alloy).

In the first exposure, a photo mask having circuit patterns for the first chiplet CL1 is set in the exposure apparatus, and a first exposure process is performed to form a latent pattern in the photo resist layer PR. The exposure is performed in a step-and-repeat manner with a row axis pitch P1 and a column axis pitch P2. Then, while retaining the wafer on the wafer stage of the exposure apparatus, the photo mask for the first chiplet CL1 is replaced with a photo mask for the second chiplet CL2. A second exposure process is performed to form a latent pattern in the photo resist layer PR in a step-and-repeat manner with the row axis pitch P1 and the column axis pitch P2. Similar operations are performed by using a photo mask for the third chiplet CL3 and a photo mask for the fourth chiplet CL4. After the four exposure steps are performed, the photo resist layer PR is subjected to a development process to form a photo resist pattern. Then, one or more subsequent processes, such as an etching operation, are performed on the underlying layer UL over the entire wafer. In some embodiments, the technology node for fabricating the multiple chiplets is the same among the chiplets. For example, a minimum resolution or a design rules of all chiplets are the same.

It is understood that even when the size of the chiplets are different within the chip, the step-and-repeat exposure process is generally the same as that explained above. In the case of the layout shown in FIG. 3D, however, the exposure of the first and second chiplets may be performed with two different row axis pitches.

Figures 5A, 5B:
FIGS. 5A and 5B illustrate a wiring scheme to connect adjacent chiplets (dies) with conductive wires according to embodiments of the present disclosure.

As set forth above, the monolithic IC includes multiple chiplets, each of which performs designed functions. These chiplets are electrically connected in the monolithic IC to function as an IC as a whole. FIGS. 5A and 5B illustrate a wiring scheme to connect adjacent chiplets with conductive wires. In some embodiments, the wiring pattern, which is referred to as a die-to-die connection pattern, is formed by using one or more photo mask. FIGS. 5A and 5B illustrate such a photo mask pattern for the die-to-die (DTD) connection. Each of FIGS. 5A and 5B shows a plan view (layout) and a cross sectional view corresponding to lines X1-X1 and Y1-Y1.

Similar to the circuit patterns in each of the chiplets, the DTD connection pattern is formed as photo resist pattern using a photo mask. In some embodiments, the exposure size of the DTD connection pattern is the same as the exposure size (die size) of each of the chiplets, where the chiplets have the same die size. As shown in FIG. 5A, the exposure area for the DTD connection pattern only partially overlaps the first chiplet CL1 and the second chiplet CL2 with an equal amount (50%) of overlap in some embodiments. In other embodiments, the overlapping amount is different between the first chiplet and the second chiplet. In the four chiplet cases as shown in FIG. 5B, the exposure area for the DTD connection pattern only partially overlaps the first, second, third and fourth chiplets CL1-CL4, with an equal amount (25%) of overlap in some embodiments. In other embodiments, the overlapping amount is different among the first to fourth chiplets. After the photo resist pattern is formed, one or more etching operations and conductive film formation operations are performed to form a conductive connection pattern connecting adjacent chiplets. As shown in FIGS. 5A and 5B, the conductive connection pattern is covered by one or more dielectric layers. In some embodiments the DTD connection pattern includes vias (vertical connections) and wires (lateral connections) and thus at least two photo masks (two lithography processes) are used to form such conductive connection patterns.

Figure 6B:
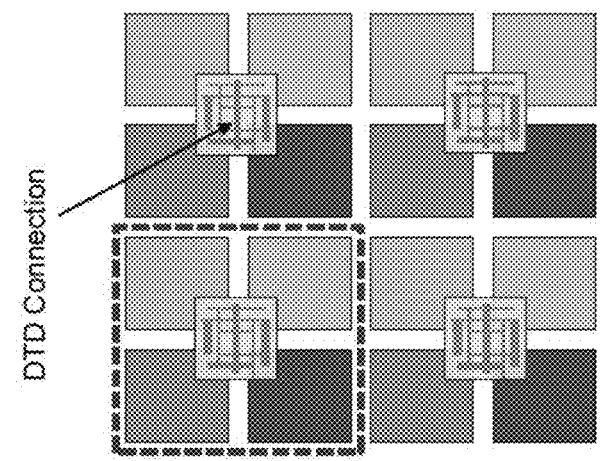
FIGS. 6A and 6B illustrate a wiring scheme to connect adjacent chiplets (dies) with conductive wires according to embodiments of the present disclosure.
Figure 6A:
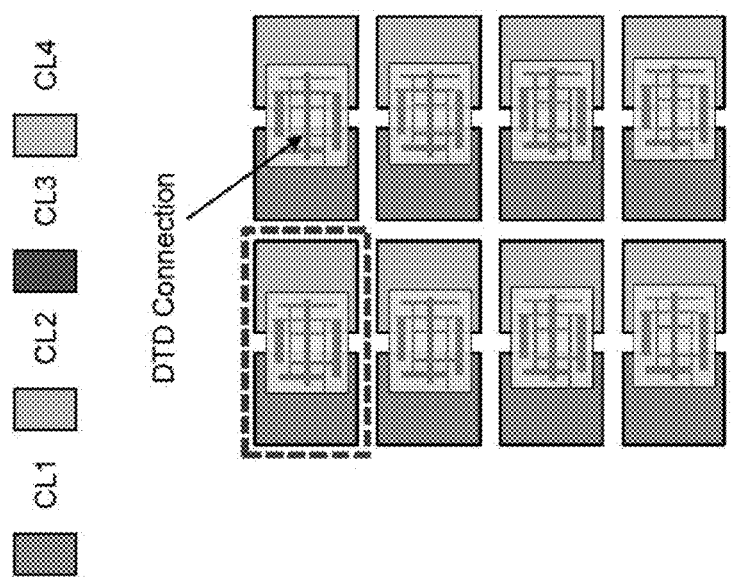

In other embodiments, the exposure size of the DTD connection pattern is different, for example, smaller than the exposure size (die size) of each of the chiplets as shown in FIGS. 6A and 6B.

In some embodiments, the die-to-die connection pattern is formed after all the metal wiring layers in the chiplets are formed. In some embodiments, the die-to-die connection pattern is formed after all the metal wiring layers except for bonding pad patterns in the chiplets are formed.

FIGS. 7A-7E show various views of a sequential process for fabricating die-to-die (DTD) connection patterns according to embodiments of the present disclosure. It is understood that additional operations can be provided before, during, and after processes shown by FIGS. 7A-7E, and some of the operations described below can be replaced or eliminated, for additional embodiments of the method. The order of the operations/processes may be interchangeable.

In some embodiments, each of the chiplets CL1 and CL2 includes transistors and multilayer wiring structures MW. Fabrication processes for the chiplets CL1 and CL2 are simultaneously performed over a wafer, and thus, the number of multilayer wirings is the same between the first chiplet CL1 and the second chiplet CL2.

FIG. 7A shows a structure after the uppermost underlying conductive pattern ULP to be directly connected to the DTD connection pattern is formed. A die-to-die space DTDS is disposed between the first chiplet CL1 and the second chiplet CL2. In some embodiments, one or more dielectric layers are formed over the die-to-die space DTDS. In some embodiments, one or more pieces of conductive material are disposed in the die-to-die space DTDS, which are not a part of the functional circuit of the chiplets CL1 and CL2. In some embodiments, the uppermost underlying conductive pattern ULP includes a bonding pad, on which an Au wire or a bump electrode is formed.

Then, one or more dielectric layers DL is formed over the underlying conductive pattern. In some embodiments, the dielectric layer includes one or more of silicon oxide, silicon nitride, SiON, SiCN, SiOCN, SiON or any other suitable dielectric material. The dielectric layer is formed by chemical vapor deposition (CVD), including low pressure CVD (LPCVD) and plasma enhanced CVD (PECVD), physical vapor deposition (PVD), atomic layer deposition (ALD), or other suitable process.

Then, as shown in FIG. 7C, an opening pattern including contact openings and grooves is formed by using one or more lithography and etching operations. Subsequently, the contact openings and the grooved are filled with one or more conductive materials and patterned with an additional mask to form a connection pattern CP as shown in FIG. 7D. FIG. 7E is a top (plan) view of FIG. 7D.

FIGS. 8-17 show various views of a sequential process for fabricating die-to-die (DTD) connection patterns according to embodiments of the present disclosure. It is understood that additional operations can be provided before, during, and after processes shown by FIGS. 8-17, and some of the operations described below can be replaced or eliminated, for additional embodiments of the method. The order of the operations/processes may be interchangeable. Materials, processes, methods, dimensions and/or configuration as explained with the foregoing embodiments may be applied to the following embodiments, and detailed description thereof may be omitted. The operation explained with FIGS. 8-17 is directed to a dual damascene process in some embodiments.

Figure 8:
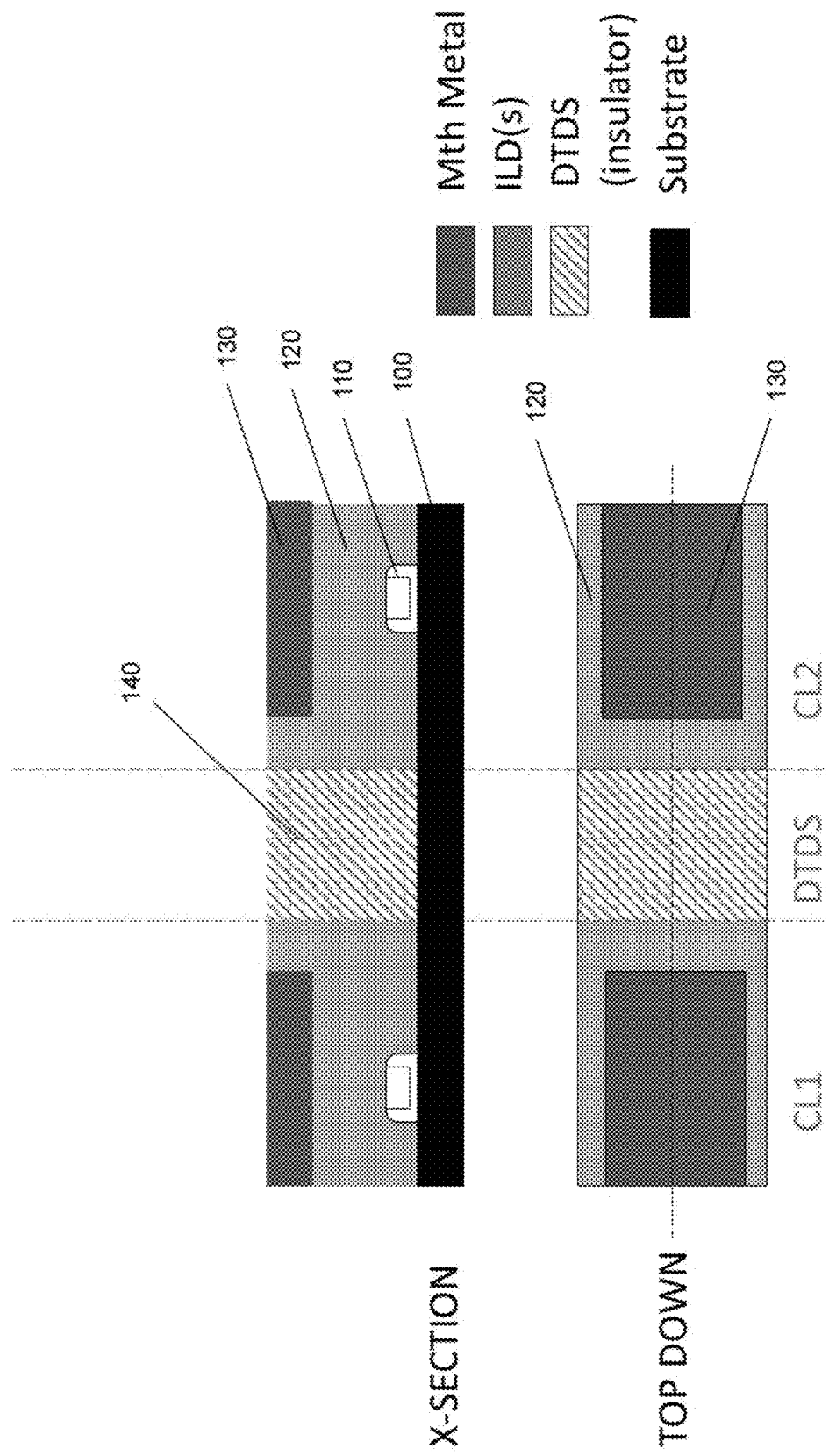
FIGS. 8, 9, 10, 11, 12, 13, 14, 15, 16 and 17 show various stages of a sequential process for fabricating die-to-die (DTD) connection patterns according to embodiments of the present disclosure.

As shown in FIG. 8, underlying devices 110 such as field effect transistors (FETs) are formed over a semiconductor wafer 100 in regions for each of the chiplets CL1 and CL2. Further, the underlying devices 110 are covered by one or more interlayer dielectric (ILD) layers 120. In various embodiments, the FET includes fin field effect transistors (FinFETs), gate all-around FET (GAA FET), and/or other MOS transistors, together with capacitors, resistances and/or other electronic elements as the underlying devices.

Each of the chiplets CL1 and CL2 include interconnect structures that include a plurality of interconnect pattern (wirings) layers having conductive patterns and a plurality of contact holes/vias for connecting various features in one portion/feature to other portions/features in the chiplet. The interconnect and via structures are formed of conductive materials such as metal, and the each of the chiplets includes several interconnect layers in various embodiments. The interconnect layer patterns in different layers are also coupled to one another through vias that extend vertically between one or several interconnect layers. The interconnect layer patterns can represent bit lines, signal lines, word lines, power supply lines and various input/output connections in some embodiments. In some embodiments of the disclosure, each of the interconnect structures is formed by a dual or single damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments. Multiple patterning lithography processes are used to form densely arranged interconnects and/or vias below the resolution limit of the photolithography process.

In some embodiments, the semiconductor wafer is a silicon wafer. Alternatively, the wafer may include another elementary semiconductor, such as germanium; a compound semiconductor including Group IV-IV compound semiconductors, such as SiC and SiGe, Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. Amorphous layer, such as amorphous Si or amorphous SiC, or an insulating material, such as silicon oxide may also be used as the wafer. The wafer may include various regions that have been suitably doped with impurities (e.g., p-type or n-type conductivity).

The ILD or IMD layers include silicon oxide, silicon nitride, silicon oxynitride (SiON), SiOCN, fluorine-doped silicate glass (FSG), or a low-k dielectric material, or any other suitable dielectric material. The ILD layers may be formed by chemical vapor deposition (CVD) or other suitable film forming processes.

In some embodiments, the interconnect layers include M-layers, where M is a natural number of 2 or more and 20 or less. FIG. 8 shows, for example, the uppermost M-th wiring layer 130 only for simplicity. However, it should be noted that the structure includes the first to M−1 interconnect layers which are electrically connected to the underlying structures, such as transistors. As shown in FIG. 8, the M-th wiring layer 130 is embedded in the uppermost layer of the ILD layer 120. In some embodiments, the M-th wiring layer 130 of the chiplets includes a bonding pad, on which an Au wire or a bump electrode is formed. Similar to FIGS. 7A-7D, one or more dielectric layers 140 are formed in the die-to-die space DTDS.

Figure 9:
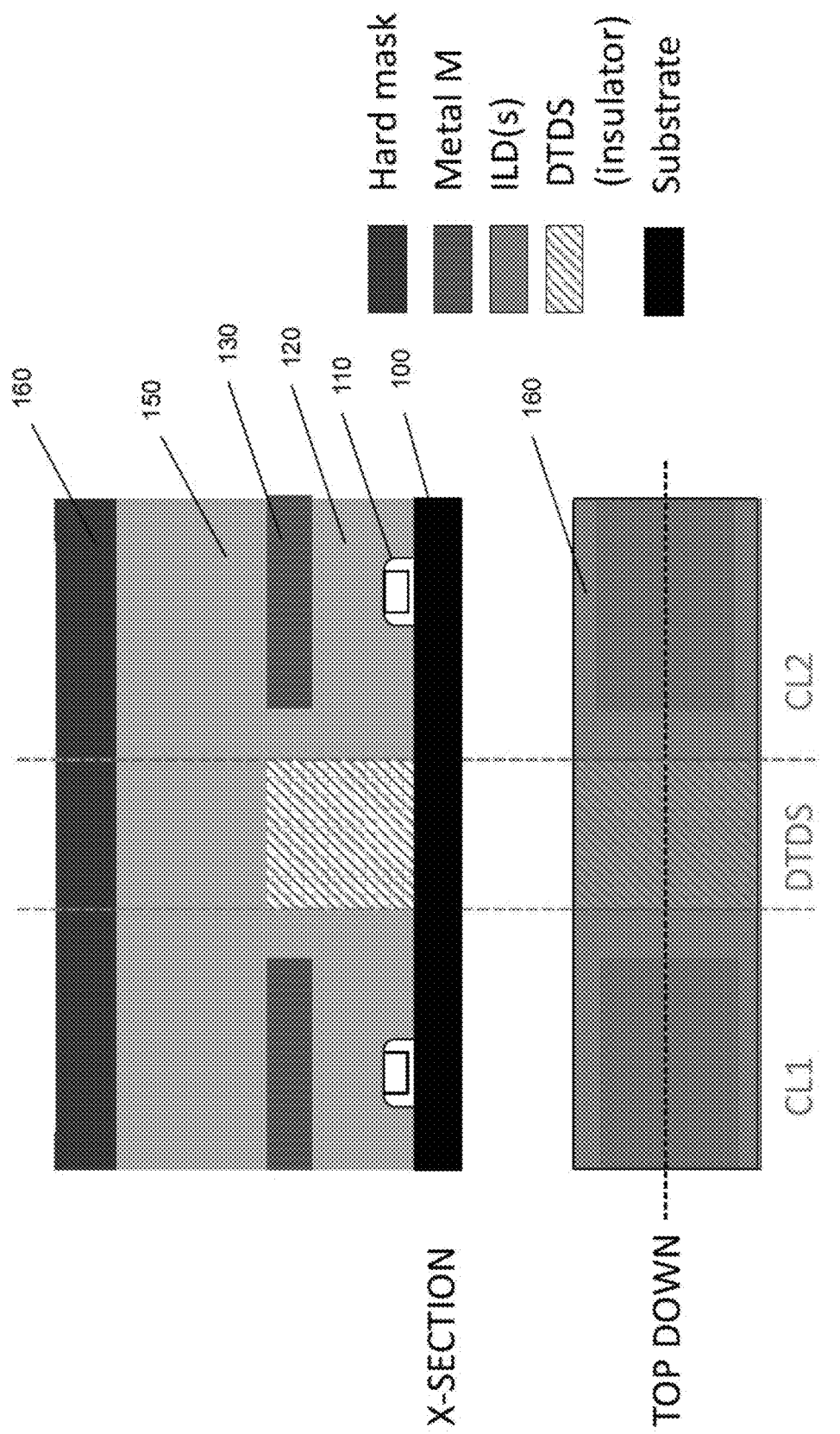

Then, as shown in FIG. 9, one or more dielectric layers 150 are formed over the M-th metal wiring layer 130. The dielectric layer 150 includes silicon oxide, silicon nitride, silicon oxynitride (SiON), SiOCN, fluorine-doped silicate glass (FSG), or a low-k dielectric material, or any other suitable dielectric material. The dielectric layer 150 may be formed by chemical vapor deposition (CVD) or other suitable film forming processes. Further, in some embodiments, a hard mask layer 160 is formed over the dielectric layer 150. In some embodiments, the hard mask layer 160 is made of a different material than the dielectric layer 150 and includes at least one of silicon oxide, silicon nitride, silicon oxynitride (SiON), SiOCN, aluminum oxide, hafnium oxide or other suitable dielectric material, amorphous or polycrystalline semiconductor material (Si, Ge, or SiGe), or conductive material (e.g., TiN).

Figure 10:
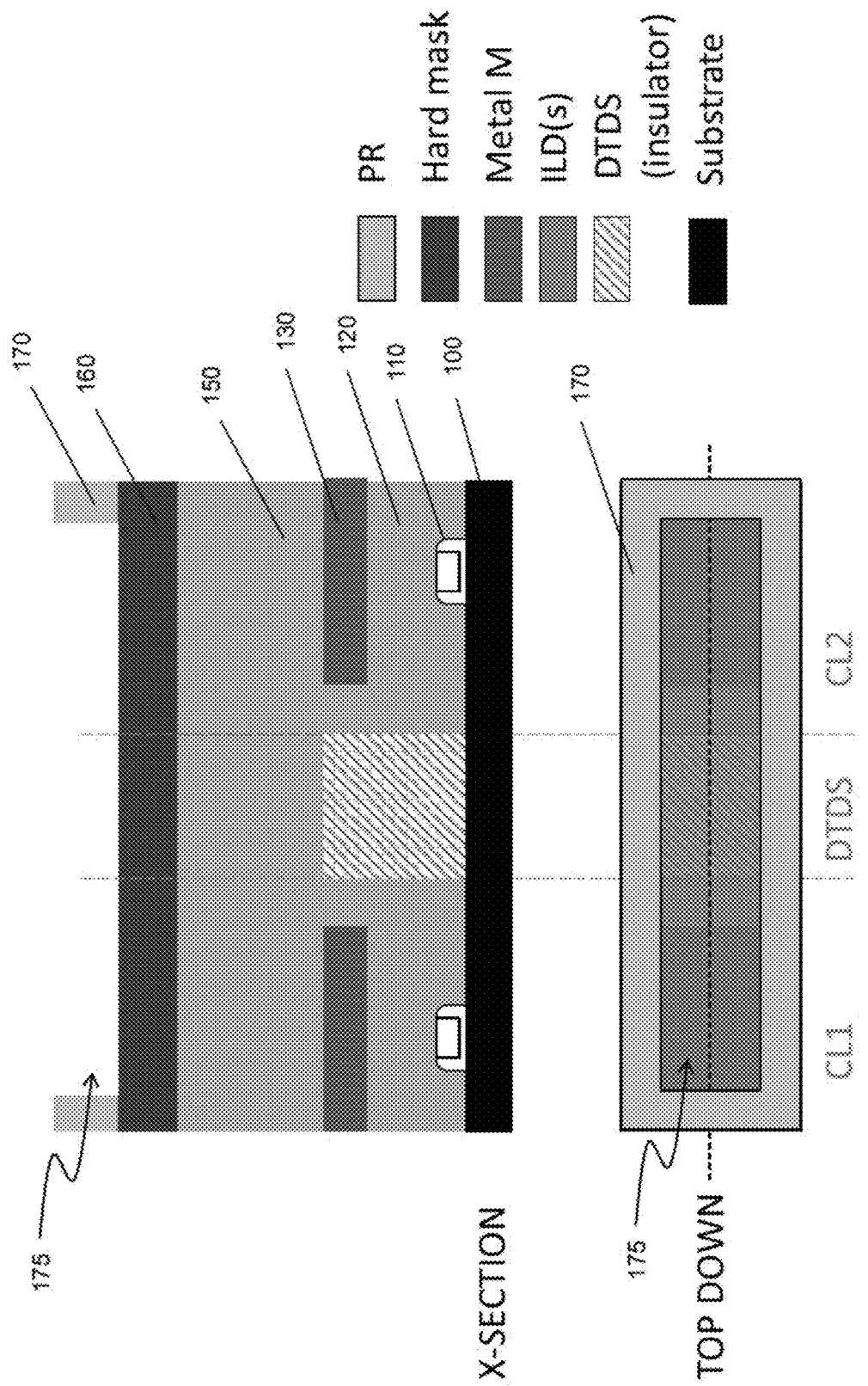

Then, as shown in FIG. 10, a first mask pattern 170 having an opening 175 is formed over the hard mask layer 160 by using a lithography operation. In some embodiments, the first mask pattern 170 is a photo resist pattern. In some embodiments, the first mask pattern 170 is an organic bottom antireflective coating (BARC) layer or a photo resist layer on the BARC layer. As explained above, the exposure area in the lithography operation to form the first mask pattern 170 only partially overlaps with the regions for the first chiplet CL1 and the second chiplet CL2.

Figure 11:
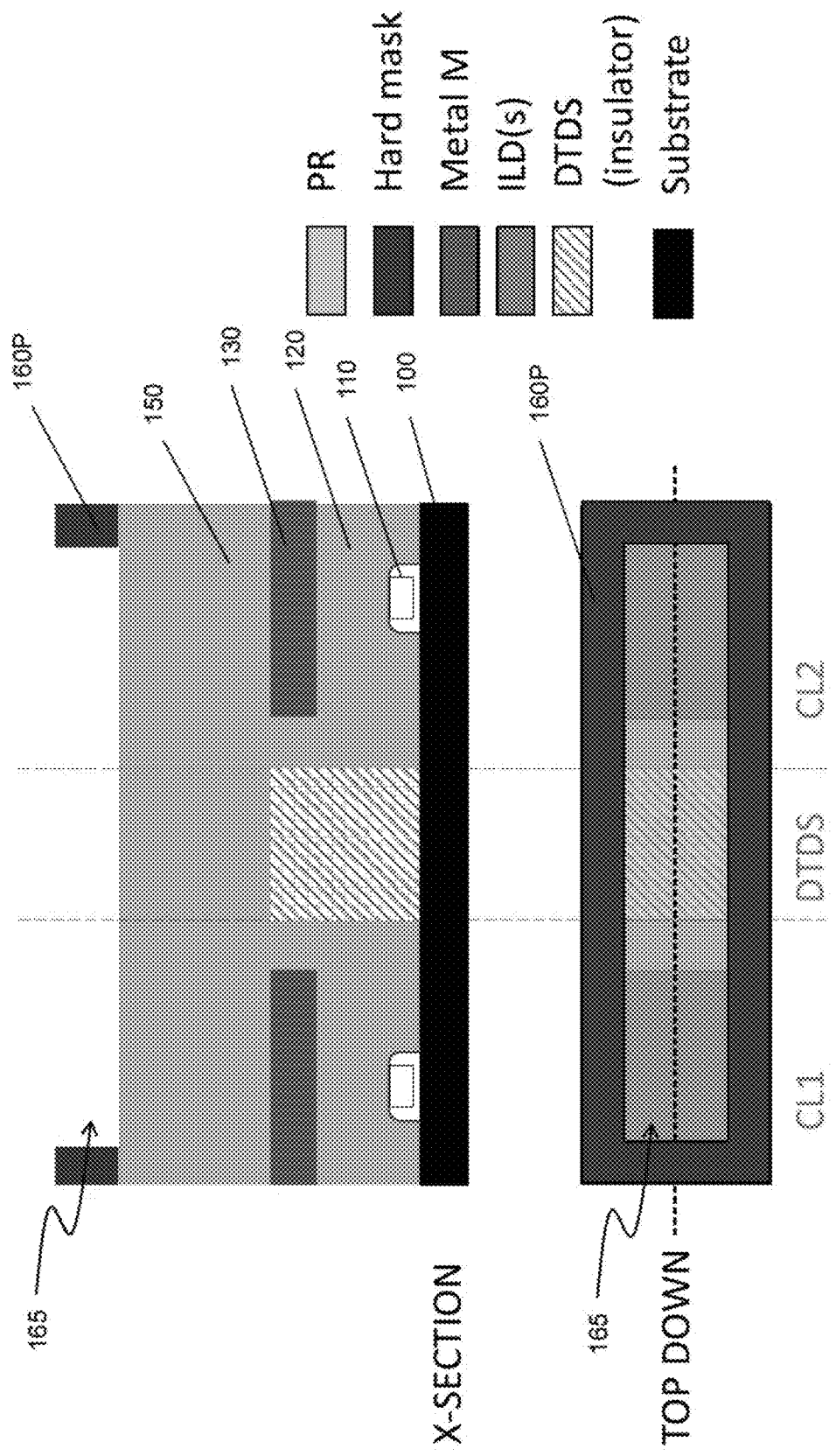

Next, as shown in FIG. 11, the hard mask layer 160 is patterned to form a hard mask pattern 160P, by using one or more etching operations. As shown in FIG. 11, the hard mask pattern 160P includes a trench pattern 165.

Figure 12:
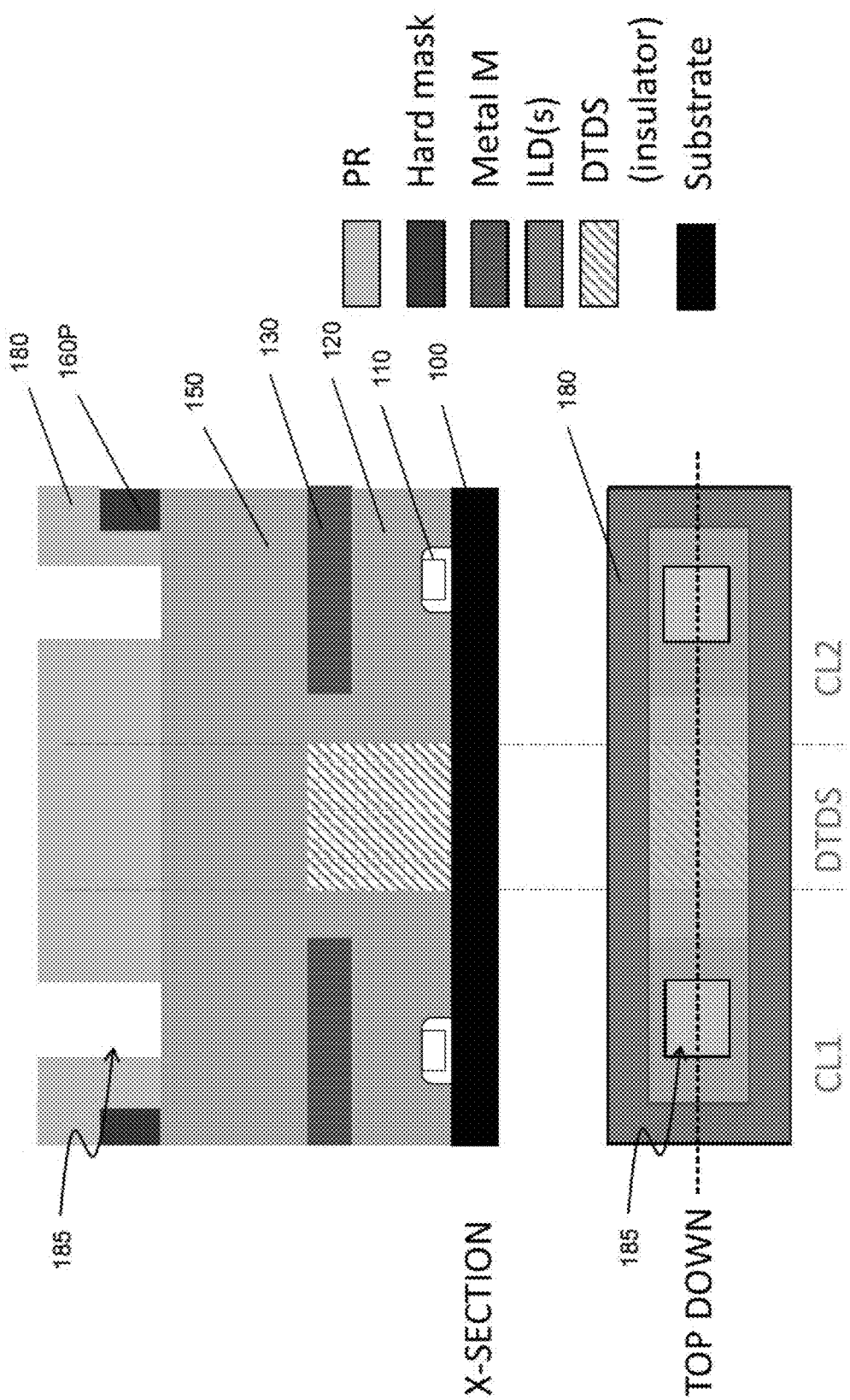

Further, as shown in FIG. 12, a second mask pattern 180 having an opening 185 is formed over the hard mask pattern 160P and the dielectric layer 150 by using a lithography operation. In some embodiments, the second mask pattern 180 is a photo resist pattern, and in other embodiments, the second mask pattern 180 is a BARC layer or a photo resist layer on the BARC layer. As explained above, the exposure area in the lithography operation to form the second mask pattern 180 only partially overlaps with the regions for the first chiplet CL1 and the second chiplet CL2. The opening 185 is a hole pattern in some embodiments.

Figure 13:
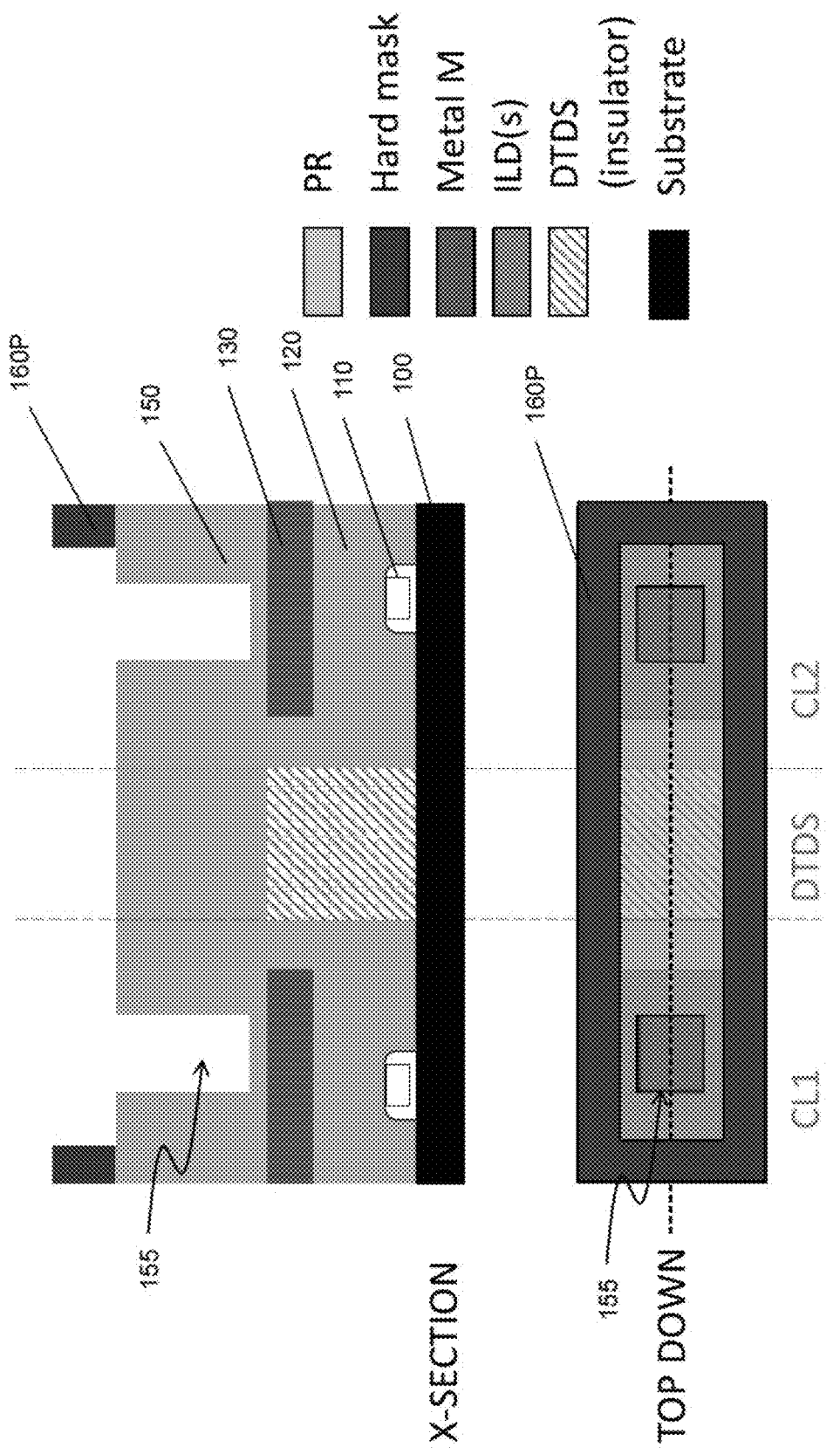

Then, by using the second mask pattern 180 as an etching mask, the dielectric layer 150 is patterned to form holes 155 as shown in FIG. 13. In some embodiments, the etching stops before reaching the M-th metal wiring layer 130, and in other embodiments, the M-th metal wiring 130 is exposed at the bottom of the holes 155. Subsequently, the second mask pattern 180 is removed.

Figure 14:
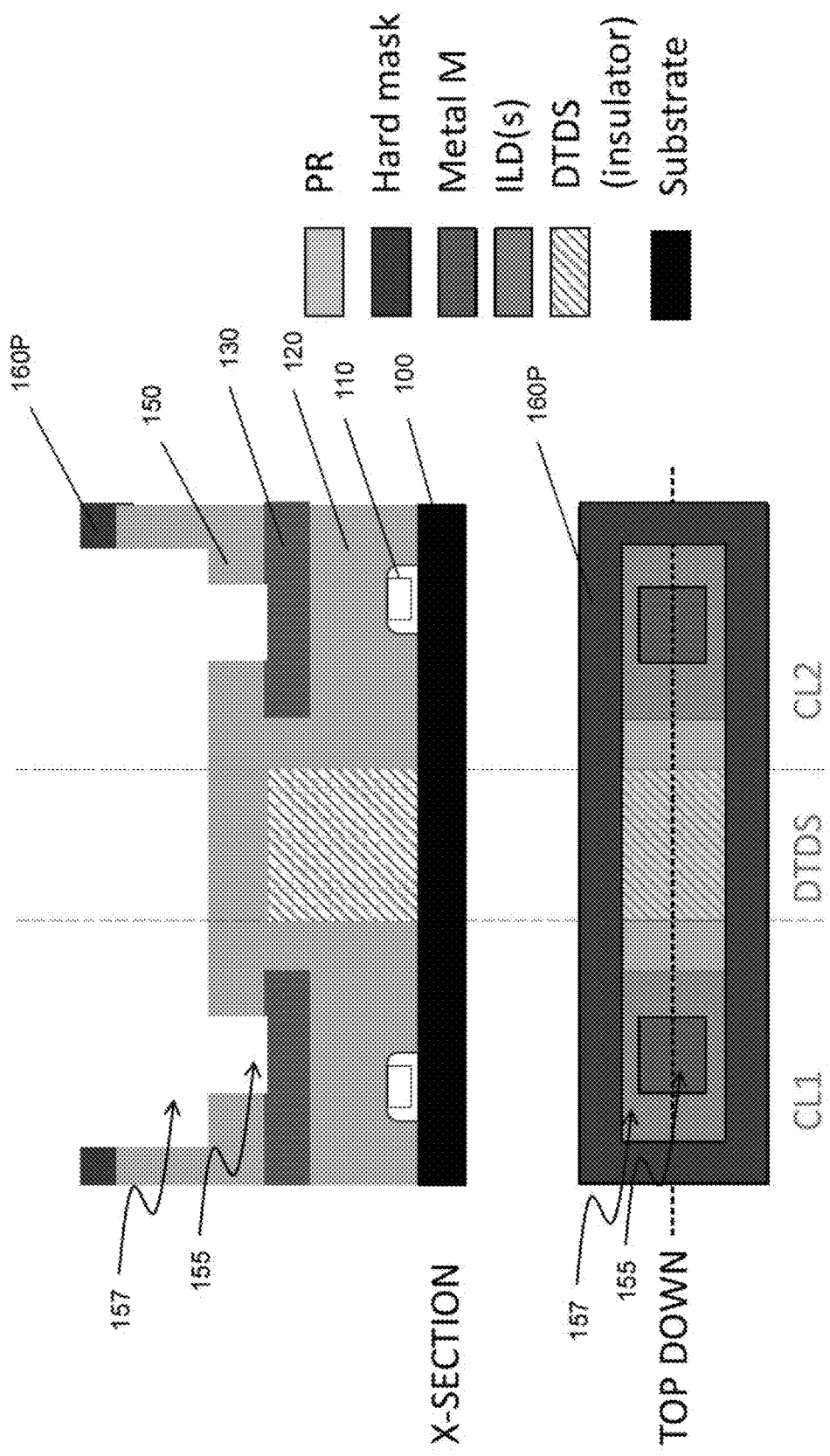

Next, as shown in FIG. 14, by using the hard mask pattern 160P as an etching mask, the dielectric layer 150 is further patterned to form a trench 157. As shown in FIG. 14, the M-th metal wiring 130 is exposed at the bottom of the hole 155.

Figure 15:
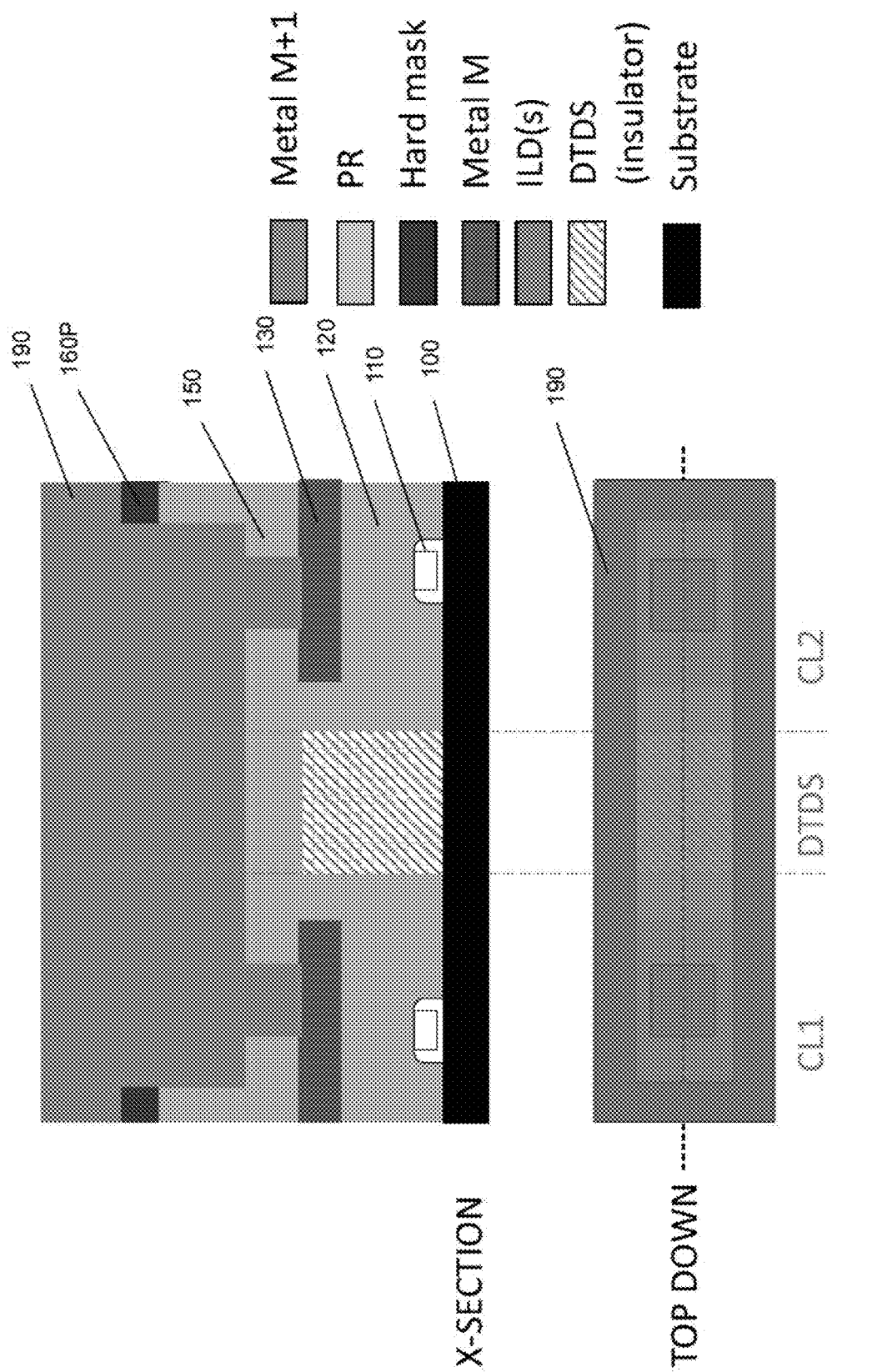

After the trench 157 and the holes 155 are formed in the dielectric layer 150, one or more conductive layers 190 is formed in the trench 157 and the holes 155 and over the hard mask pattern 160P, as shown in FIG. 15. The conductive layer 190 includes one or more layers of conductive material, such as, aluminum, copper, titanium, tantalum, tungsten, cobalt, molybdenum, tantalum nitride, nickel, TiN, TaN, metal alloys, other suitable materials, and/or combinations thereof. The conductive layer 190 may be formed by CVD, ALD, electro-plating, or other suitable method.

Figure 16:
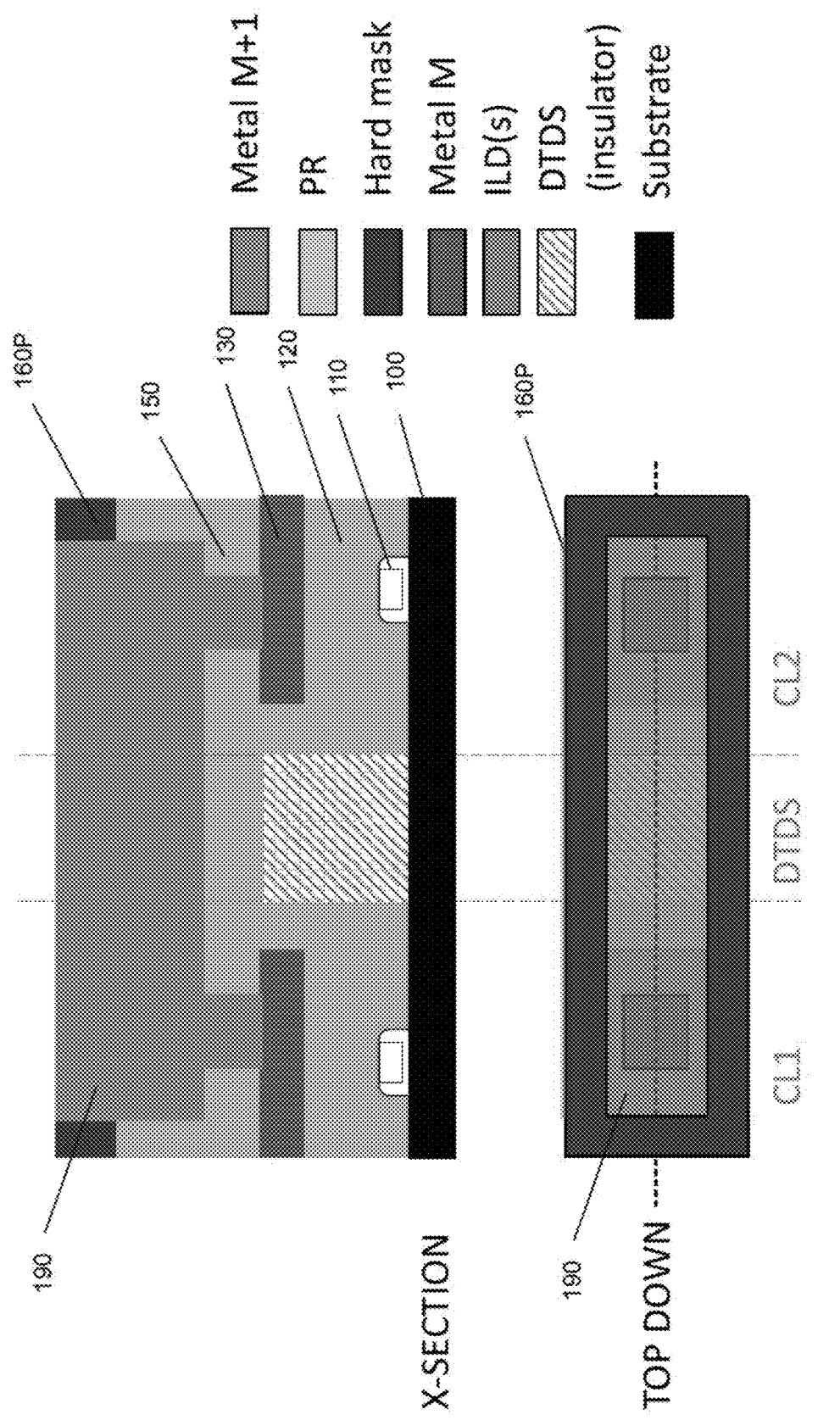
Figure 17:
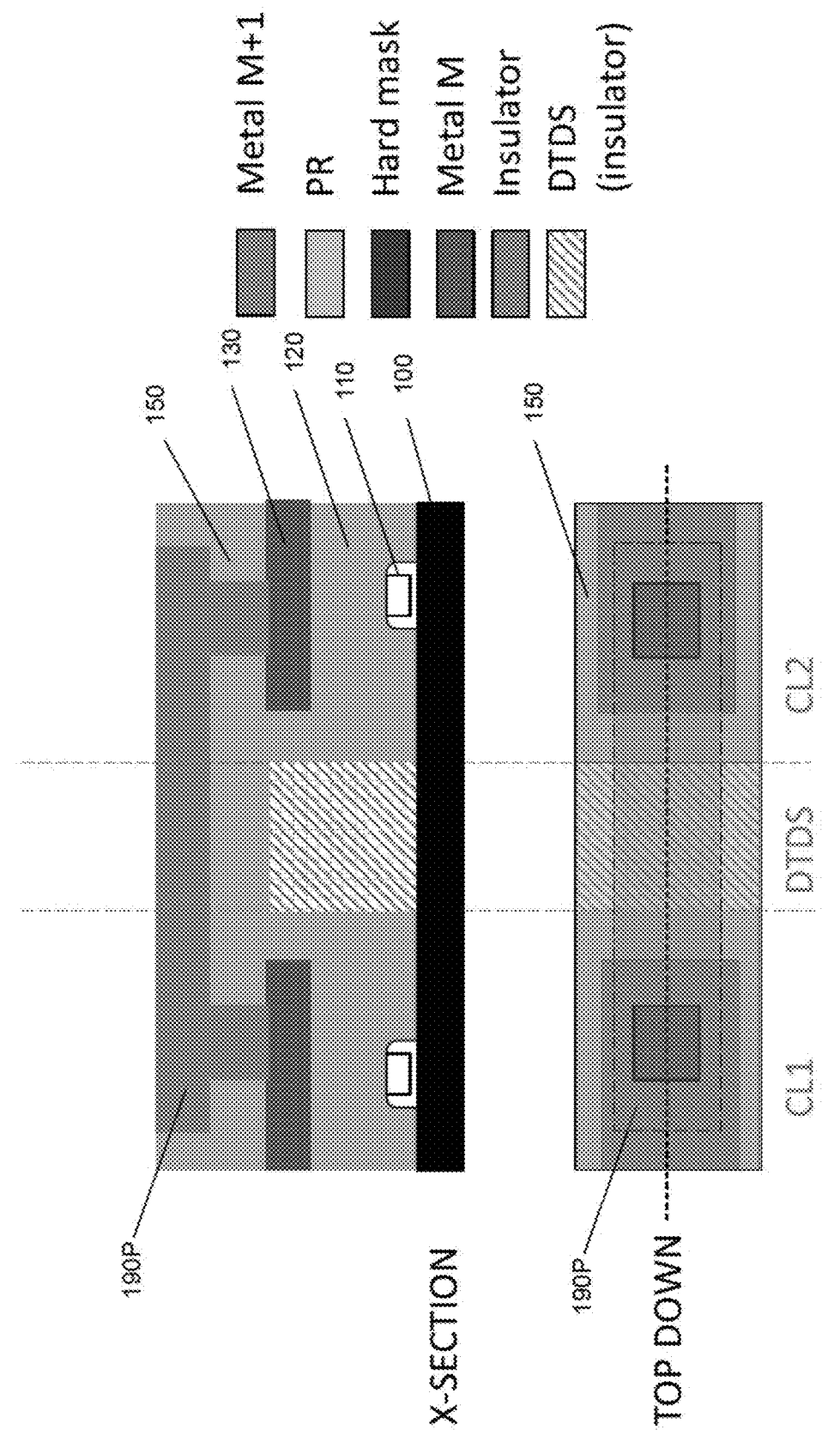

Then, one or more planarization operations, such as a CMP operation, is performed to remove excess conductive layer 190 over the hard mask pattern 160P, as shown in FIG. 16. In some embodiments, the CMP operation stops at the hard mask pattern 160P. Then, additional one or more planarization operations, such as a CMP operation, is performed to remove the conductive layer 190 and the hard mask pattern, thereby forming a die-to-die connection pattern 190P, as shown in FIG. 17. In some embodiments, the CMP operation stops at the dielectric layer 150. In other embodiments, the dielectric layer 150 is partially removed in the CMP operation. The number of photo lithography operations (resist coating, exposure and development) is two for forming the DTD connection patterns 190P. Although FIG. 17 shows one connection pattern 190P, it is understood that a plurality of connection patterns 190P are formed to electrically and functionally connect the chiplet CL1 and CL2 in some embodiments.

Figure 7F:
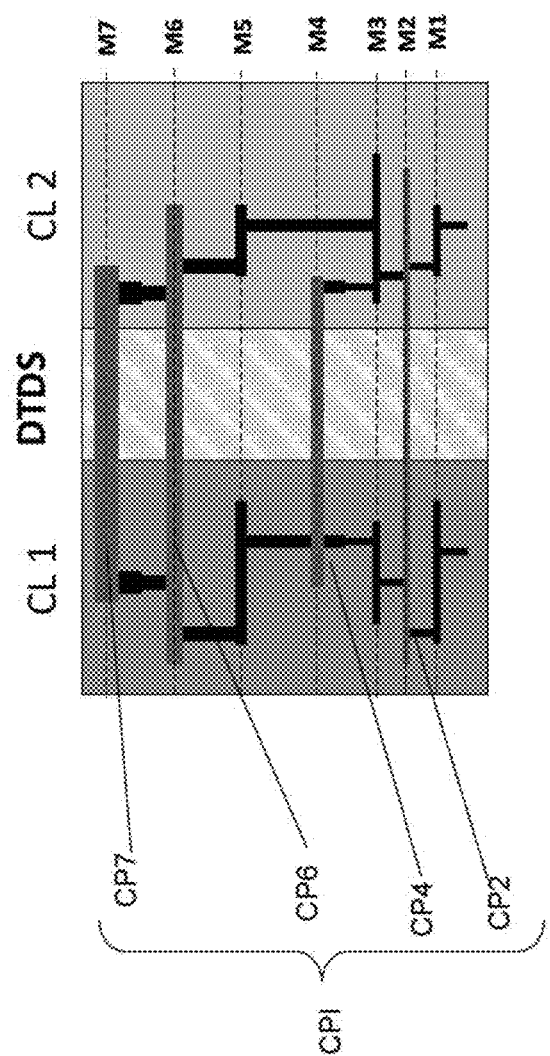
FIG. 7F shows a cross sectional view of die-to-die (DTD) connection patterns according to embodiments of the present disclosure.

In the foregoing embodiments, the DTD connection patterns 190P is formed as the M+1-th layer above the M-th interconnect layer of the chiplets CL1 and CL2. In other embodiments, as shown in FIG. 7F, the DTD connection patterns CPI are formed at one or more of the second or third to the M-th interconnect layer (e.g. I-th interconnect layer)

of the chiplets CL1 and CL2. FIG. 7F shows DTD connection patterns CP2, CP4, CP6 and CP7, where CP7 is the M-th layer. In such a case, the DTD connection pattern formation process (e.g., dual damascene process as shown by FIGS. 8-17) for the DTD connection pattern 190P is performed with conductive pattern formation processes the same as forming the interconnect patterns for the chiplets. In other embodiments, an additional connection pattern formation process is performed for the DTD connection pattern 190P before or after conductive pattern formation process for the same interconnect patterns for the chiplets CL1 and CL2.

Although FIGS. 8-17 illustrate one connection pattern having one horizontal (lateral) part and two vertical part (vias), the configuration of the connection pattern is not limited to this embodiment. In some embodiments, a plurality of connection patterns are formed over the die-to-die space electrically connecting the first chiplet and the second chiplet. In some embodiments, one connection pattern includes two or more vias within one of the first or second chiplet. In some embodiments, the horizontal part is branched or has one or more bent portions (e.g., an L-shape, a crank shape, etc.).

Figure 18:
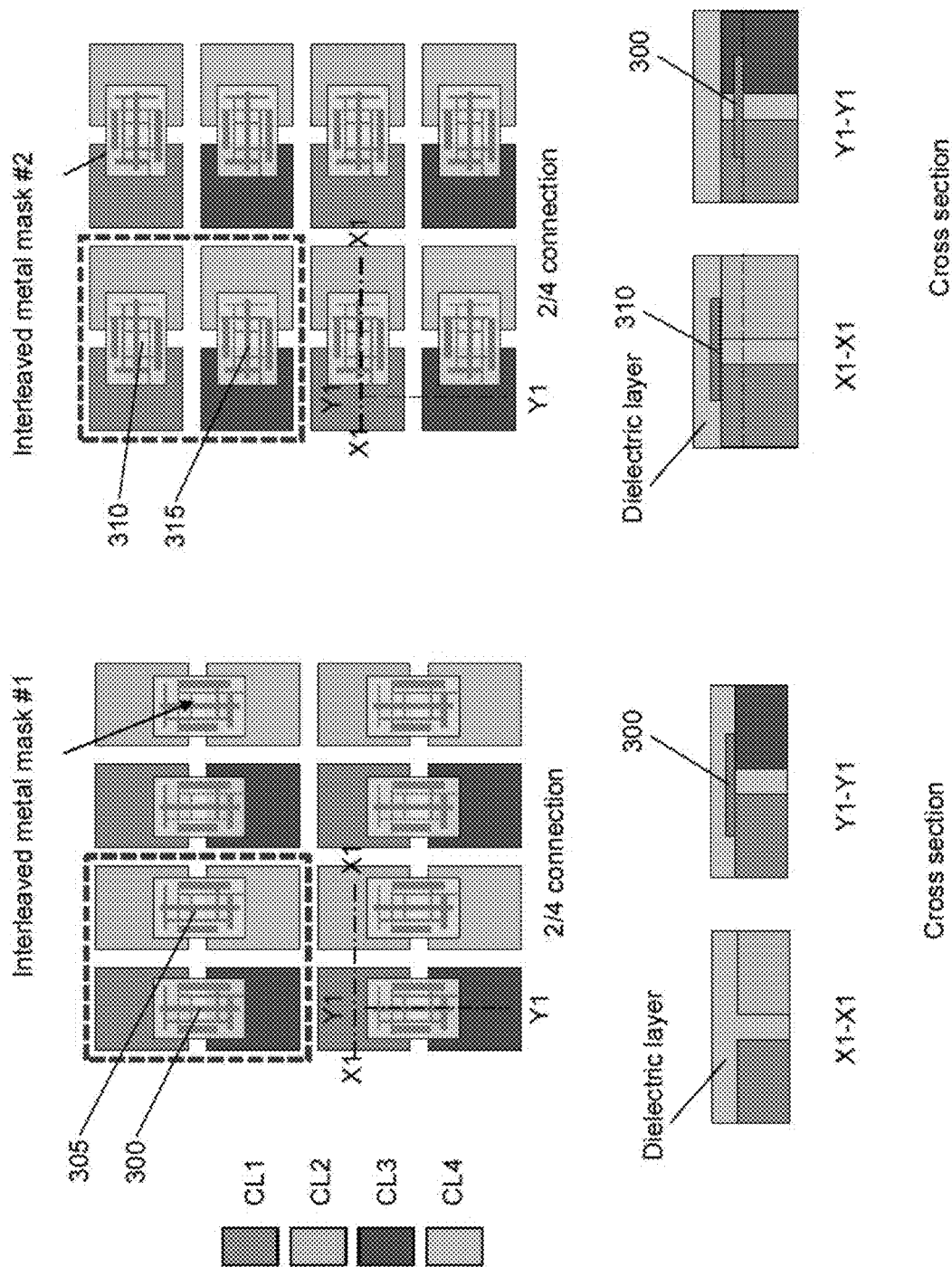
FIGS. 18A and 18B illustrate a wiring scheme to connect adjacent chiplets (dies) with conductive wires according to embodiments of the present disclosure.

FIGS. 18A and 18B show layouts of the die-to-die connection patterns (exposure areas) according to embodiments of the present disclosure. Materials, processes, methods, dimensions and/or configuration as explained with the foregoing embodiments may be applied to the following embodiments, and detailed description thereof may be omitted.

In the embodiments, shown in FIGS. 5A and 5B, the exposure area corresponding to the die-to-die connection pattern partially overlap all chiplets in the chip area, and the DTD connection patterns are formed in the same interconnection layer as explained with respect to FIGS. 8-17.

In the embodiments of FIGS. 18A and 18B, the exposure area corresponding to the die-to-die connection pattern partially overlap only some and not all of the chiplets in the chip area, and the DTD connection patterns are formed in two or more different interconnection layers.

In some embodiments, the chiplets CL1 and CL3 and chiplets CL2 and CL4 are connected by connection patterns 300, 305, respectively, as shown in FIG. 18A, and the chiplets CL1 and CL2 and chiplets CL3 and CL4 are connected by connection patterns 310, 315, respectively, as shown in FIG. 18B. The exposure area of the lithography operations for the DTD connection pattern 300 has the same area as the exposure area of the chiplets CL1 and CL3 in some embodiments, has a different (smaller) size than the exposure area of the chiplets CL1 and CL3. Similarly, the exposure area of the lithography operations for the DTD connection pattern 305 has the same area as the exposure area of the chiplets CL2 and CL4 in some embodiments, has a different (smaller) size than the exposure area of the chiplets CL2 and CL4. The exposure area of the lithography operations for the DTD connection pattern 310 has the same area as the exposure area of the chiplets CL1 and CL2 in some embodiments, has a different (smaller) size than the exposure area of the chiplets CL1 and CL2. Similarly, the exposure area of the lithography operations for the DTD connection pattern 315 has the same area as the exposure area of the chiplets CL3 and CL4 in some embodiments, has a different (smaller) size than the exposure area of the chiplets CL3 and CL4.

As shown in FIG. 18B, the interconnect layer of the DTD connection patterns 310 and 315 is different from the interconnect layer of the DTD connection patterns 300 and 305.

In some embodiments, the DTD connection patterns 300 and 305 are located at the K-th interconnect level, and the DTD connection patterns 310 and 315 are located at the L-th interconnect level, where K and L are a natural number more than 2 and equal to or less than M+1. In some embodiments, K is greater than L, and in other embodiments, K is smaller than L. The difference between K and L is any number of 1 to 3 in some embodiments. In certain embodiments, K=M and L=M+1. In some embodiments, the conductive pattern formation process (e.g., dual damascene process as shown by FIGS. 8-17) for the DTD connection patterns 300 and 305 (or 301 and 315) is performed with the conductive pattern formation process for the K-th (or L-th) interconnect patterns for the chiplets. In such a case, in a lithography operation, a photo resist layer is formed, exposure processes for the chiplets CL1-CL4 and the DTD connection pattern are performed, the exposed photo resist layer is developed, and an etching operation is performed. In other embodiment, an additional conductive pattern formation process is performed for the DTD connection patterns 300 and 305 (or 310 and 315) in addition to the conductive pattern formation process for the K-th (or L-th) interconnect patterns for the chiplets. In such a case, before or after lithography and etching operations for the chiplets CL1-CL4 are performed, lithography and etching operations for the DTD connection pattern are performed.

In some embodiments, a mask pattern for the DTD connection pattern 300 (or 305) is the same as a mask pattern for the DTD connection pattern 305 (or 315). In such a case, the exposure of the mask pattern for the DTD connection patterns 300 and 305 is repeated with the half pitch in the raw of the entire chip in some embodiments. In other embodiments, the mask pattern for the DTD connection pattern 300 (or 305) is different from the mask pattern for the DTD connection pattern 305 (or 315).

Figure 19:
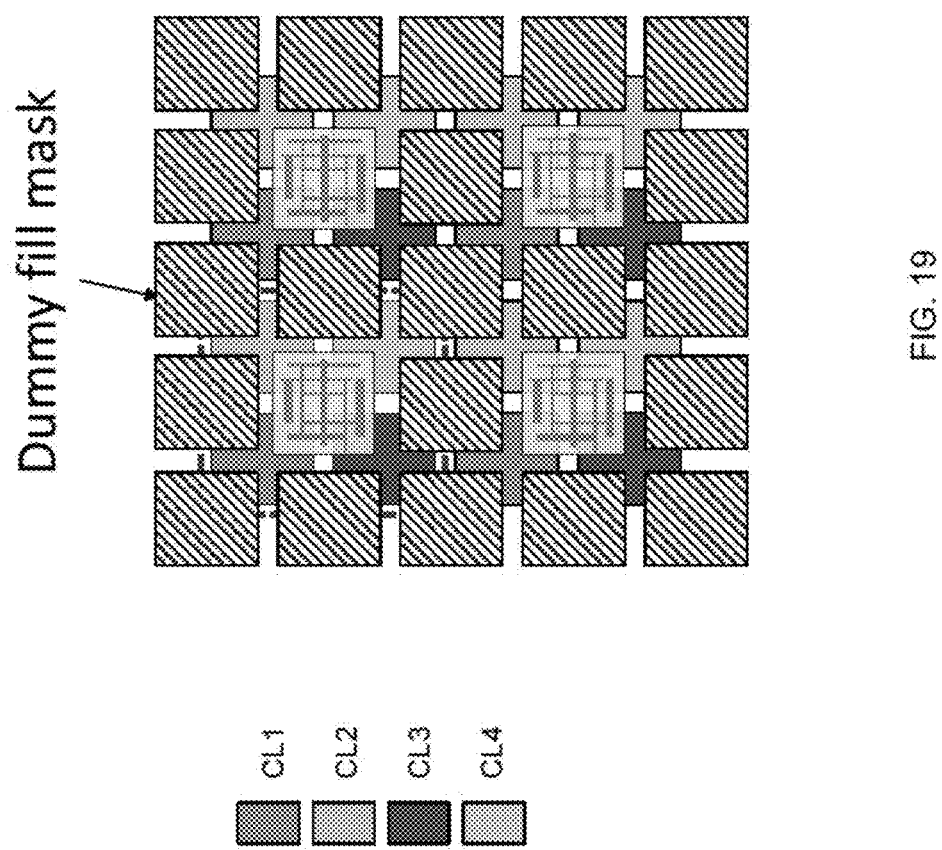
FIG. 19 illustrates an exposure map (layout) according to embodiments of the present disclosure.

FIG. 19 shows an exposure area layout according to an embodiment of the present disclosure. As set forth above, in the dual damascene technology of FIGS. 8-17, a CMP operation is employed. In a CMP operation, when pattern density or pattern sizes are not uniform, the etching amount of the target layer is not uniform, which may cause various issues, such as local dishing. To avoid such issues, dummy patterns are formed according to an embodiment of the present disclosure.

In some embodiments, in a lithography operation for connection patterns, before or after an exposure operation using a photo mask for trench patterns of the DTD connection patterns on a photo resist layer, one or more additional exposure operations using one or more other photo masks than the photo mask for the trench patterns of the DTD connection pattern are performed on the photo resist layer, as shown in FIG. 19. The one or more other photo masks include dummy patterns for improving uniformity of the CMP operation. After the exposure operations for the trench patterns of the DTD connection pattern and the dummy patterns, a development process for the exposed photo resist is performed.

In some embodiments, the dummy patterns include periodically or regularly arranged line, box or hole patterns having a pattern size and/or density substantially equal to a pattern size and/or density of the DTD connection patterns. In some embodiments, the pattern density and/or the density of the dummy patterns in an exposure area is less than about ±10% of the pattern size and/or density of the trench patterns of the DTD connection pattern in an exposure area. In some embodiments, some parts of the regularly arranged dummy patterns are missing depending on the layout of the underlying wiring patterns to reduce parasitic capacitance. When the dummy pattern exposure for the CMP operation is performed, the number of lithography operations is three in some embodiments.

Figure 20:
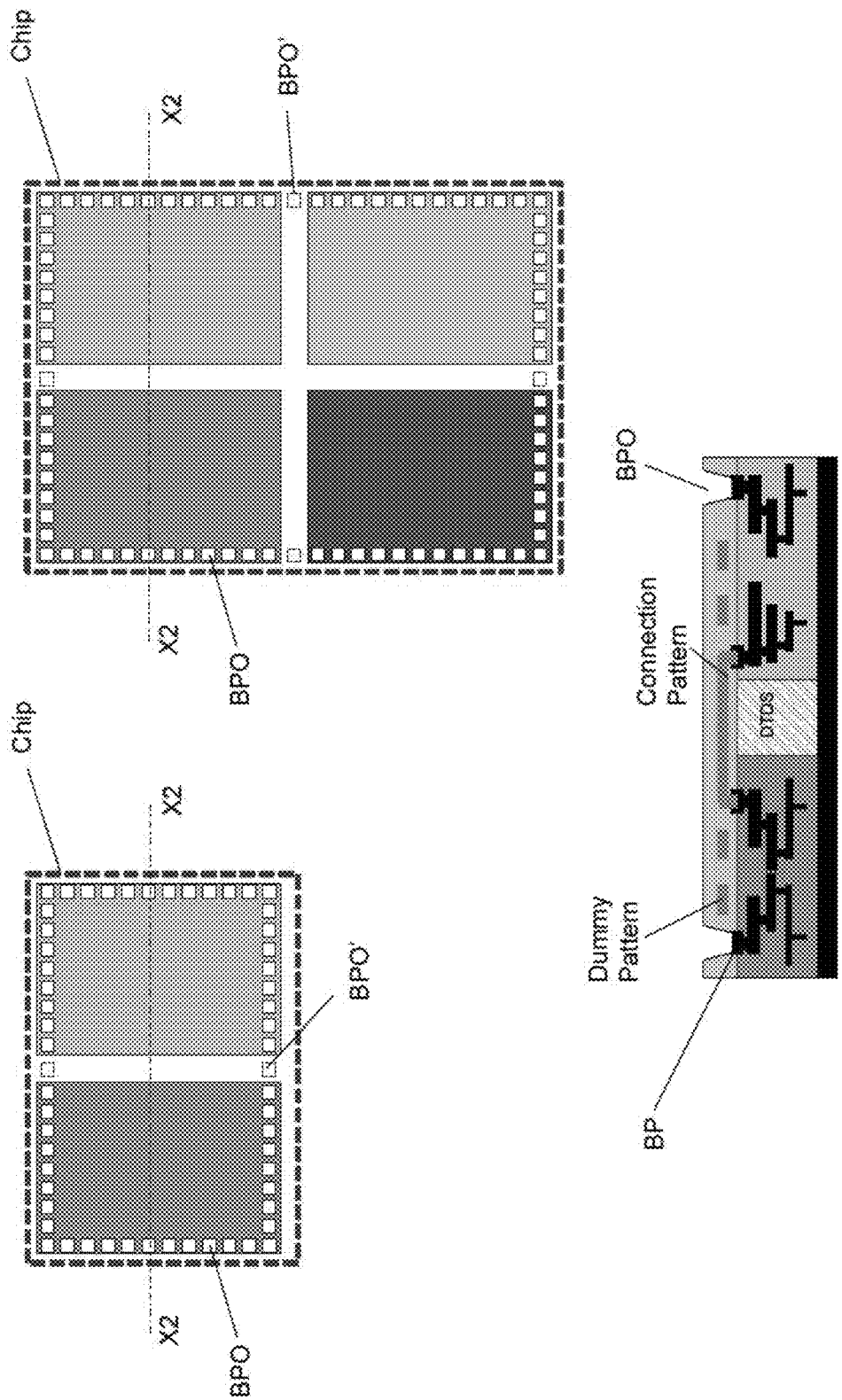
FIG. 20 illustrates layouts or arrangements of bonding pads or pad electrodes according to embodiments of the present disclosure.

FIG. 20 shows an arrangement of bonding pads or pad electrodes BP and an opening over the bonding pads BPO. After the DTD connection patterns are formed, one or more insulating layers (passivation layer) are formed over the DTD connection patterns, and openings for bonding pads or pad electrodes are formed by using one or more lithography and etching operations. FIG. 20 shows a plan view (layout view) and a cross sectional view along line X2-X2 after the openings BPO are formed.

In some embodiments, as shown in FIG. 20, the bonding pads or pad electrodes BP (located below the opening BPO) are arranged along three sides (only) of each of the chiplets CL1 and CL2, which are along the outer periphery of the entire chip. More specifically, three or more openings BPO (and thus three or more bonding pads or pad electrodes BP) are arranged along three sides (only, and thus not all four sides) of each of the chiplets CL1 and CL2. In some embodiments, one or more conductive layers are formed over the bonding pads BP in the openings for the bonding pads BPO. No pad electrodes or openings for the pad electrodes are formed over the DTD connection pattern in some embodiments. In other words, the die-to-die connection patterns are used only for connecting the circuits in the adjacent chiplets and are not used for connection to outside the chip. In other embodiments, an optional opening BPO' is formed in the die-to-die space DTDS over the DTD connection pattern along the periphery of the chip as shown in FIG. 20.

In other embodiments, as shown in FIG. 20, the bonding pads or pad electrodes BP (located below the opening BPO) are arranged along two sides (only) of each of the chiplets CL1-CL4, which are along the outer periphery of the entire chip. More specifically, two or more openings BPO (and thus three or more bonding pads or pad electrodes BP) are arranged along two sides (only, and thus not all four sides) of each of the chiplets CL1-CL4. In some embodiments, one or more conductive layers are formed over the bonding pads BP in the openings for the bonding pads BPO. No pad electrodes or openings for the pad electrodes are formed over the DTD connection pattern in some embodiments. In other words, the die-to-die connection patterns are used only for connecting the circuits in the adjacent chiplets and are not used for connection to outside the chip. In other embodiments, an optional opening BPO' is formed in the die-to-die space DTDS over the DTD connection pattern along the periphery of the chip as shown in FIG. 20. In some embodiments, when the dummy patterns for the CMP operation are formed, the dummy patterns are located at the same level (height) as the horizontal portion of the connection pattern. The dummy patterns are not electrically connected to the first or second chiplets, and may be electrically floating (not connected to any fixed potential including the ground).

Figure 21C:
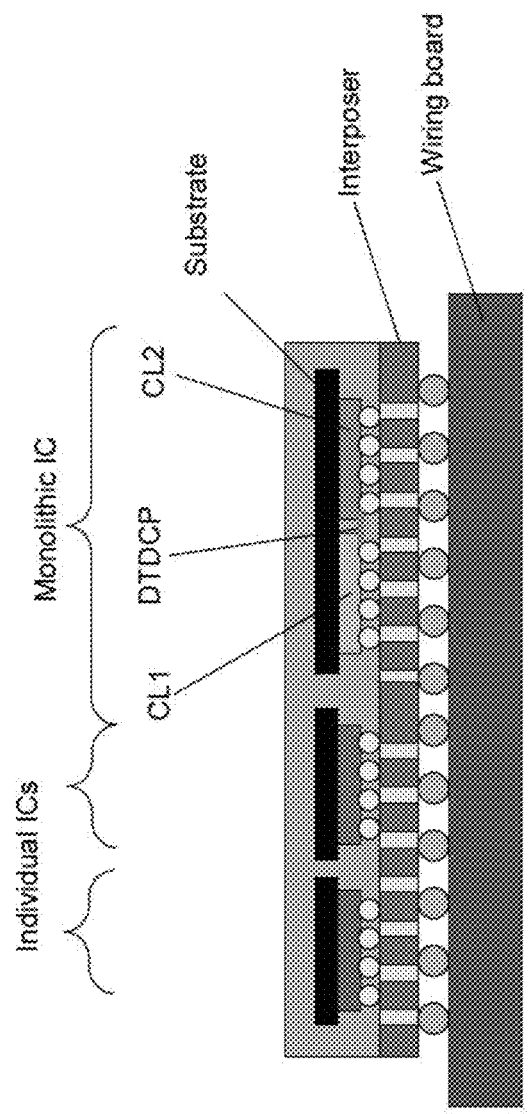

FIGS. 21A-21C illustrate packaged semiconductor devices according to embodiments of the present disclosure. In some embodiments, as shown in FIG. 21A, a semiconductor chip including a semiconductor substrate (e.g., a Si substrate) cut out from a semiconductor wafer and two or more chiplets (dies) formed on the semiconductor substrate is molded by a mold resin. The semiconductor chip is placed on a die pad and electrically connected to lead frames via Au wires. As set forth above, die-to-die connection patterns DTDCP is formed over one or more dielectric layers in the die-to-die space between the chiplets on the semiconductor substrate, and electrically connects adjacent chiplets. In some embodiments, two or more semiconductor chips each including multiple chiplets are molded in the mold resin.

In other embodiments, as shown in FIG. 21B, the semiconductor chip is electrically connected to an interposer substrate via ball electrodes. The interposer substrate includes re-distribution wirings and through via electrodes, and is connected to a wiring board via ball electrodes.

In some embodiments, as shown in FIG. 21C, the semiconductor device includes one or more monolithic ICs as explained above and one or more individual ICs, each of which has a chip size within the exposure area of the lithography apparatus, packaged together.

In some embodiments, the size of the chip (diced semiconductor substrate) having a rectangular shape is greater than 858 mm$^2$ (26×33 mm$^2$). In other embodiments, at least the shorter side of chip having a rectangular shape is greater than 26 mm. The semiconductor device according to the embodiments includes a single semiconductor substrate on which semiconductor circuits are formed as multiple chiplets connected by connection patterns bridging over die-to-die spaces and has a greater size than an effective exposure area corresponding to the photo mask (reticle), and the semiconductor substrate is molded as a single semiconductor package.

The various embodiments or examples described herein offer several advantages over the existing art. In the embodiments of the present disclosure, since the multiple chiplets are connected by die-to-die connection patterns, it is possible to obtain a large scale monolithic integration beyond the reticle size limitation.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first circuit of a first chiplet and a second circuit of a second chiplet are provided. Both of the first circuit and the second circuit are formed over a chip region of a semiconductor wafer and separated by a dielectric layer disposed over a die-to-die space between the first chiplet and the second chiplet. Conductive connection patterns that electrically connect the first circuit and the second circuit are formed over the die-to-die space. In one or more of the foregoing and following embodiments, the chip region has a larger area than a maximum exposure area of a lithography apparatus used to fabricate the first and second circuits. In one or more of the foregoing and following embodiments, the semiconductor wafer is diced to form a semiconductor chip including the chip region, on which the first chiplet and the second chiplet are provided. In one or more of the foregoing and following embodiments, an exposure area in lithography operations to fabricate the first circuit, an exposure area in lithography operations to fabricate the second circuit and an exposure area in lithography operations to fabricate the conductive connection patterns are the same. In one or more of the foregoing and following embodiments, an exposure area in lithography operations to fabricate the conductive connection patterns is smaller than an exposure area in lithography operations to fabricate the first circuit, an exposure area in lithography operations to fabricate the second circuit. In one or more of the foregoing and following embodiments, the conductive connection patterns connect patterns at an uppermost conductive layer of the first circuit and patterns at an uppermost conductive layer of the second circuit. In one or more of the foregoing and following embodiments, the die-to-die space comprise no functional circuit electrically connected to at least one of the first circuit or the second circuit, other than the conductive connection patterns.

In accordance with another aspect of the present disclosure, in a method of manufacturing a semiconductor device, a first photo resist layer is formed over an underlying layer disposed over a semiconductor wafer, a first exposure is performed on the first photo resist layer using a first photo mask for a first chiplet, and a second exposure is performed on the first photo resist layer using a second photo mask for a second chiplet. A first circuit pattern area in a first exposure area of the first exposure do not overlap a second circuit pattern area in a second exposure area of the second exposure. The first photo resist layer is developed to form a first photo resist pattern. An etching operation is performed on the underlying layer using the first photo resist pattern as an etching mask to form an underlying pattern. A second photo resist layer is formed over an underlying structure including the underlying pattern disposed over the semiconductor wafer, and a third exposure using a third photo mask is performed on the first photo resist layer, wherein a third exposure area of the third exposure partially overlaps the first exposure area and the second exposure area. In one or more of the foregoing and following embodiments, the first exposure area, the second exposure area and the third exposure area have the same size. In one or more of the foregoing and following embodiments, the first exposure area is different in size than the second exposure area. In one or more of the foregoing and following embodiments, the third exposure area is different in size than at least one of the first exposure area or the second exposure area. In one or more of the foregoing and following embodiments, the semiconductor wafer is diced to form a plurality of semiconductor chip so that each of the plurality of the semiconductor chips comprises the first exposure area, the second exposure area and the third exposure area. In one or more of the foregoing and following embodiments, a size of each of the plurality of semiconductor chips has a larger area than a maximum exposure area of a lithography apparatus used in the first, second and third exposures. In one or more of the foregoing and following embodiments, each of the first, second and third exposures is repeated to form a matrix of exposure areas with a row pitch P1 and a column pitch P2.

In accordance with another aspect of the present disclosure, in a method of manufacturing a semiconductor device, a first circuit of a first chiplet to a M-th interconnect level, and a second circuit of a second chiplet to the M-th interconnect level are formed. Both of the first circuit and the second circuit are formed over a chip region of a semiconductor wafer and separated by a dielectric layer disposed over a die-to-die space between the first chiplet and the second chiplet. A dielectric layer is formed over the first and second circuits and the die-to-die space, a hard mask layer is formed over the dielectric layer, a first lithography operation is performed to form a first resist pattern including a first opening over the first circuit, the second circuit and the die-to-die space, a hard mask pattern having a second opening corresponding to the first opening is formed by patterning the hard mask layer by using the first resist pattern as an etching mask, and a second lithography operation is performed to form a second resist pattern including third openings over the first circuit and the second circuit, respectively. No opening is formed on the die-to-die space. Holes are formed in the dielectric layer by patterning the dielectric layer by using the second resist pattern as an etching mask, a trench is formed in the dielectric layer by patterning the dielectric layer by using the hard mask pattern as an etching mask, the trench and the holes are filled with one or more conductive layers, and a connection pattern connecting the first circuit and the second circuit is formed by performing a chemical mechanical polishing operation on the one or more conductive layers. In one or more of the foregoing and following embodiments, one or more passivation layers are formed over the connection pattern, and openings are formed to expose pad electrodes of the first circuit and second circuit. Three or more openings are arranged along at least two sides, but not all of four sides, of each of the first and second chiplets. In one or more of the foregoing and following embodiments, the semiconductor wafer is diced to form a semiconductor chip including the chip region, on which the first chiplet and the second chiplet are provided. In one or more of the foregoing and following embodiments, an exposure area in the first and second lithography operations partially overlap the first chiplet and the second chiplet. In one or more of the foregoing and following embodiments, in the second lithography operation, a photo resist layer is formed over the dielectric layer, a first exposure is performed on the photo resist layer using a first photo mask for the first opening, a second exposure is performed using a second photo mask for dummy patterns on the photo resist layer, and the photo resist layer is developed. In one or more of the foregoing and following embodiments, the chemical mechanical polishing operation includes a first chemical mechanical polishing operation that stops at the hard mask pattern, and a second chemical mechanical polishing operation removing the hard mask pattern.

In accordance with another aspect of the present disclosure, a semiconductor device includes a semiconductor substrate diced from a semiconductor wafer, a first chiplet comprising a first circuit and a second chiplet comprising a second circuit, both of which are disposed over the semiconductor substrate and which are separated by a die-to-die space filled with a dielectric material, and a plurality of conductive connection patterns connecting the first circuit and the second circuit and disposed over the die-to-die space. In one or more of the foregoing and following embodiments, at least the shorter side of the semiconductor substrate is greater than 26 mm. In one or more of the foregoing and following embodiments, the die-to-die space comprises no functional circuit electrically connected to at least one of the first circuit or the second circuit, other than the plurality of conductive connection patterns. In one or more of the foregoing and following embodiments, the semiconductor device further includes one or more passivation layers covering the first circuit, the second circuit and the plurality of connection patterns. In one or more of the foregoing and following embodiments, the semiconductor device further includes a mold resin encapsulating the semiconductor substrate with the first and second chiplets and the plurality of connection patterns. In one or more of the foregoing and following embodiments, the plurality of conductive connection patterns connect patterns at an uppermost conductive layer of the first circuit and patterns at an uppermost conductive layer of the second circuit. In one or more of the foregoing and following embodiments, each of the first and second circuits includes M layers of interconnect layers, where M is a natural number more than two, and the plurality of conductive connection patterns connect patterns at an I-th layer of the M layers of the first circuit and patterns at the I-th layer of the M layers of the second circuit, wherein N is smaller than M. In one or more of the foregoing and following embodiments, the semiconductor device further includes dummy conductive patterns formed at a same level as the plurality of connection patterns.

In accordance with another aspect of the present disclosure, a semiconductor device molded in a mold resin includes a semiconductor substrate, a first chiplet including a first circuit, a second chiplet including a second circuit, a third chiplet including a third circuit and a fourth chiplet including a fourth circuit, all of which are disposed over the semiconductor substrate and which are separated by die-to-die spaces filled with a dielectric material, respectively, and a plurality of conductive connection patterns electrically connecting the first circuit, the second circuit, the third circuit and the fourth circuit and disposed over the die-to-die spaces. In one or more of the foregoing and following embodiments, sizes of the first, second, third and fourth chiplets are same as each other. In one or more of the foregoing and following embodiments, at least one of the first, second, third and fourth chiplets has a different size from at least one of remaining chiplets. In one or more of the foregoing and following embodiments, at least the shorter side of the semiconductor substrate is greater than 26 mm. In one or more of the foregoing and following embodiments, the die-to-die spaces comprise no functional circuit electrically connected to the first, second, third and fourth circuits, other than the plurality of conductive connection patterns. In one or more of the foregoing and following embodiments, each of the first, second, third and fourth circuits includes M layers of interconnect layers, where M is a natural number more than two, the plurality of conductive connection patterns connect patterns at a K-th layer of the M layers of the first circuit and patterns at the K-th layer of the M layers of the second circuit, wherein K is a natural number equal to or smaller than M, and the plurality of conductive connection patterns connect patterns at an L-th layer of the M layers of the third circuit and patterns at the L-th layer of the M layers of the fourth circuit, wherein L is a natural number and equal to or smaller than M. In one or more of the foregoing and following embodiments, K is different from L. In one or more of the foregoing and following embodiments, K and L are equal to M. In one or more of the foregoing and following embodiments, at least two of the first, second, third and fourth chiplets have same functionality.

In accordance with another aspect of the present disclosure, a semiconductor device molded in a mold resin includes a semiconductor substrate having a rectangular shape in plan view, multiple chiplets each comprising a circuit, wherein the multiple chiplets are disposed over the semiconductor substrate and are separated from each other by die-to-die spaces filled with a dielectric material, and a plurality of conductive connection patterns electrically connecting the multiple chiplets so that a combination of the circuit of the multiple chiplet function as one functional circuit. The plurality of conductive connection patterns is disposed over the die-to-die spaces. In one or more of the foregoing and following embodiments, at least the shorter side of the semiconductor substrate is greater than 26 mm. In one or more of the foregoing and following embodiments, the semiconductor device further includes another semiconductor substrate on which a circuit is formed, and the size of the another semiconductor substrate is smaller than 26×33 mm². In one or more of the foregoing and following embodiments, at least one of the chiplets includes a memory device occupying more than 75% of an area of the at least one of the chiplets. The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first photo resist layer over an underlying layer disposed over a semiconductor wafer;
   performing a first exposure on the first photo resist layer using a first photo mask for a first chiplet;
   performing a second exposure on the first photo resist layer using a second photo mask for a second chiplet, wherein a first circuit pattern area in a first exposure area of the first exposure does not overlap a second circuit pattern area in a second exposure area of the second exposure;
   developing the first photo resist layer to form a first photo resist pattern;
   performing an etching operation on the underlying layer using the first photo resist pattern as an etching mask to form an underlying pattern;
   forming a second photo resist layer over an underlying structure including the underlying pattern disposed over the semiconductor wafer; and
   performing a third exposure using a third photo mask on the second photo resist layer, wherein a third exposure area of the third exposure partially overlaps the first exposure area and the second exposure area.

2. The method of claim 1, wherein the first exposure area, the second exposure area and the third exposure area have the same size.

3. The method of claim 1, wherein the first exposure area is different in size than the second exposure area.

4. The method of claim 1, wherein the third exposure area is different in size than at least one of the first exposure area or the second exposure area.

5. The method of claim 1, wherein each of the first, second and third exposures is repeated to form a matrix of exposure areas with a row pitch P1 and a column pitch P2.

6. The method of claim 1, further comprising forming a conductive connection pattern that electrically connects a first circuit in the first circuit pattern area and a second circuit in the second circuit pattern area.

7. The method of claim 6, further comprising dicing the semiconductor wafer to form a plurality of semiconductor chips so that each of the plurality of semiconductor chips comprises the first exposure area, the second exposure area and the third exposure area.

8. The method of claim 7, wherein a size of each of the plurality of semiconductor chips has a larger area than a maximum exposure area of a lithography apparatus used in the first, second and third exposures.

9. The method of claim 6, wherein the conductive connection pattern is disposed over a die-to-die space between the first chiplet and the second chiplet.

10. The method of claim 9, wherein the conductive connection patterns connect patterns at an uppermost conductive layer of the first circuit and patterns at an uppermost conductive layer of the second circuit.

11. The method of claim 9, wherein the die-to-die space comprises no functional circuit electrically connected to at least one of the first circuit or the second circuit, other than the conductive connection patterns.

12. The method of claim 9, wherein:
the underlying structure includes a dielectric layer formed over the underlying pattern and a hard mask layer formed over the dielectric layer, and
the second photo resist layer is formed over the hard mask layer.

13. The method of claim 12, wherein:
the third exposure forms a second photo resist pattern including a first opening over the first circuit, the second circuit and a die-to-die space between the first chiplet and the second chiplet.

14. The method of claim 13, further comprising:
forming a hard mask pattern having a second opening corresponding to the first opening by patterning the hard mask layer by using the second photo resist pattern as an etching mask;
performing a fourth lithography operation to form a third photo resist pattern including third openings over the first circuit and the second circuit, respectively, wherein no opening is formed on the die-to-die space;
forming holes in the dielectric layer by patterning the dielectric layer by using the third photo resist pattern as an etching mask;
forming a trench in the dielectric layer by patterning the dielectric layer by using the hard mask pattern as an etching mask;
filling the trench and the holes with one or more conductive layers, thereby forming the conductive connection pattern.

15. The method of claim 14, the conductive connection pattern is formed by performing a chemical mechanical polishing operation on the one or more conductive layers.

16. The method of claim 14, further comprising:
forming one or more passivation layers over the conductive connection pattern;
forming openings to expose pad electrodes of the first circuit and second circuit,
wherein three or more openings are arranged along at least two sides, but not all of four sides, of each of the first and second chiplets.

17. The method of claim 1, further comprising:
performing a fourth exposure on the first photo resist layer using a fourth photo mask for a third chiplet,
wherein the first circuit pattern area, the second circuit pattern area and a third circuit pattern area in a fourth exposure area of the fourth exposure do not overlap each other.

18. The method of claim 17, wherein the third circuit pattern area is greater than the first and second circuit pattern areas.

19. The method of claim 1, further comprising:
performing a fourth exposure on the first photo resist layer using a fourth photo mask for a third chiplet; and
performing a fifth exposure on the first photo resist layer using a fifth photo mask for a fourth chiplet,
wherein the first circuit pattern area, the second circuit pattern area, a third circuit pattern area in a fourth exposure area of the fourth exposure, and a fourth circuit pattern area in a fifth exposure area of the fifth exposure do not overlap each other.

20. The method of claim 19, wherein the first circuit pattern area, the second circuit pattern area, the third circuit pattern area and the fourth circuit pattern area have a same size.

* * * * *